United States Patent
Toda et al.

(10) Patent No.: US 11,342,463 B2
(45) Date of Patent: May 24, 2022

(54) SEMICONDUCTOR DEVICE AND MANUFACTURING METHOD OF SEMICONDUCTOR DEVICE

(71) Applicant: Japan Display Inc., Tokyo (JP)

(72) Inventors: Tatsuya Toda, Tokyo (JP); Masashi Tsubuku, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/036,298

(22) Filed: Sep. 29, 2020

(65) Prior Publication Data

US 2021/0119055 A1 Apr. 22, 2021

(30) Foreign Application Priority Data

Oct. 17, 2019 (JP) .............................. JP2019-190234

(51) Int. Cl.
  *H01L 29/786* (2006.01)
  *H01L 21/473* (2006.01)

(52) U.S. Cl.
  CPC ........ *H01L 29/7869* (2013.01); *H01L 21/473* (2013.01); *H01L 29/78618* (2013.01); *H01L 29/78696* (2013.01)

(58) Field of Classification Search
  CPC ............... H01L 21/473; H01L 29/7869; H01L 29/78618; H01L 29/78696
  USPC ........................................................... 257/43
  See application file for complete search history.

(56) References Cited

U.S. PATENT DOCUMENTS

2014/0151686 A1   6/2014  Yamazaki et al.
2017/0323907 A1*  11/2017 Kitagawa .............. G02F 1/1343

FOREIGN PATENT DOCUMENTS

JP        2018-078339 A      5/2018

* cited by examiner

*Primary Examiner* — Tong-Ho Kim
(74) *Attorney, Agent, or Firm* — Michael Best & Friedrich LLP

(57) ABSTRACT

A semiconductor device comprising: an oxide semiconductor layer including indium; a gate electrode facing to the oxide semiconductor layer; a gate insulating layer between the oxide semiconductor layer and the gate electrode; a first conductive layer arranged above the oxide semiconductor layer and being in contact with the oxide semiconductor layer from above the oxide semiconductor layer; an oxide portion formed on the oxide semiconductor layer and at an edge of the first conductive layer, the oxide portion being a oxide of the first conductive layer.

7 Claims, 36 Drawing Sheets

SEMICONDUCTOR DEVICE AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2019-190234 filed on Oct. 17, 2019, the entire contents of which are incorporated herein by reference.

FIELD

An embodiment of the present invention is related to a semiconductor device and a manufacturing method of the semiconductor device. In particular, an embodiment of the present invention is related to a semiconductor device in which an oxide semiconductor is used as a channel and a manufacturing method of the semiconductor device.

BACKGROUND

In recent years, the development of a semiconductor device using an oxide semiconductor as a channel has been progressing (for example, Japanese Laid Open Patent Publication No. 2018-078339) in place of amorphous silicon, low-temperature polysilicon and single crystal silicon. The semiconductor device which uses an oxide semiconductor as a channel can be formed with a simple structure and at a low-temperature process similar to a semiconductor device which uses amorphous silicon as a channel. It is known that a semiconductor device which uses an oxide semiconductor as a channel has higher mobility than a semiconductor which device uses amorphous silicon as a channel. A semiconductor device which uses an oxide semiconductor as a channel is known to have a very low off current.

In order to stably operate for a semiconductor device which uses an oxide semiconductor, it is important to supply a large amount of oxygen to the oxide semiconductor in the manufacturing process and reduce oxygen vacancies which are formed in the oxide semiconductor. Japanese Laid Open Patent Application No. 2018-078339 discloses a technique for forming an insulating layer which covers an oxide semiconductor under a condition where the insulating layer includes a large amount of oxygen as one method for supplying oxygen to an oxide semiconductor.

However, an insulating layer formed under the condition where the insulating layer includes a large amount of oxygen will contain a lot of defects. This causes an abnormal characteristics of the semiconductor device or a characteristics fluctuation of the semiconductor device in a reliability test, which are thought to be aftereffects of electrons trapped in the defects. On the other hand, when an insulating layer with less defects is used, it is impossible to increase the oxygen contained in the insulating layer. Therefore, it is impossible to sufficiently provide oxygen from the insulating layer to the oxide semiconductor. Thus, it is required to achieve a manufacturing method of the semiconductor device and a structure of semiconductor device to improve reliability of the semiconductor device, even when the insulating layer which contains a large amount of oxygen is used as the insulating layer covering the oxide semiconductor.

SUMMARY

A semiconductor device according to an embodiment of the present invention including: an oxide semiconductor layer including indium; a gate electrode facing to the oxide semiconductor layer; a gate insulating layer between the oxide semiconductor layer and the gate electrode; a first conductive layer arranged above the oxide semiconductor layer and being in contact with the oxide semiconductor layer from above the oxide semiconductor layer; an oxide portion formed on the oxide semiconductor layer and at an edge of the first conductive layer, the oxide portion being a oxide of the first conductive layer.

A manufacturing method of a semiconductor device according to an embodiment of the present disclosure including: forming an oxide semiconductor layer including indium, a gate electrode facing to the oxide semiconductor layer and a gate insulating layer between the oxide semiconductor layer and the gate electrode; forming a first conductive layer having an edge on the oxide semiconductor layer; forming an oxide portion of the first conductive layer at the edge of the first conductive layer by performing a $N_2O$ plasma treatment to the edge of the first conductive layer.

DESCRIPTION OF EMBODIMENTS

Figure 1:
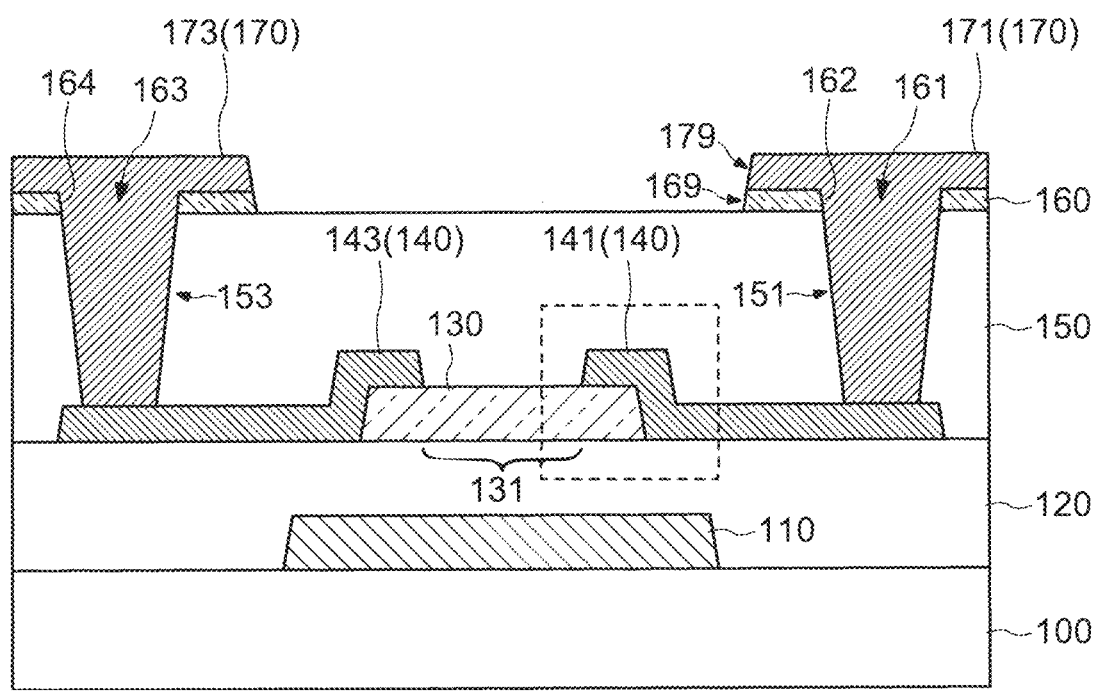
FIG. 1 is a cross-sectional view illustrating an outline of a semiconductor device according to an embodiment of the present invention.

Each embodiment of the present invention is explained below while referring to the drawings. However, the disclosure herein is only an example and a structure easily arrived at by a person skilled in the art by making appropriate modifications without departing from the concept of the invention is naturally to be contained in the scope of the present invention. The drawings may be schematically represented with the width, thickness, shape and the like of each portion as compared with the actual form in order to clarify the explanation more clearly. However, they are only an example and do not limit an interpretation of the present invention. In the specification and drawings, elements having the same functions as those described with reference to preceding figures are attached with a letter of the alphabet after the same reference symbol and a detailed explanation may be omitted as appropriate.

In each embodiment of the present invention, a direction from a substrate towards an oxide semiconductor layer is referred to as "up" or "above". Conversely, a direction from the semiconductor layer towards the substrate is referred to as "down" or "below". As described above, for the convenience of explanation, although an explanation is made using the terms "upper" or "lower", for example, the vertical relationship between the substrate and the semiconductor layer may be reversed. In the explanation below, for example, the expression "semiconductor layer on the substrate" merely describes the vertical relationship between the substrate and the semiconductor layer as described above, other members may also be arranged between the substrate and the semiconductor layer. Upper or lower means the stacking order in a structure in which a plurality of layers is stacked, and in the case when a pixel electrode is expressed as above a transistor, it may be a positional relationship in which the transistor and the pixel electrode do not overlap in a planar view. On the other hand, when a pixel electrode is expressed vertically above a transistor, it means a positional relationship in which the transistor and the pixel electrode overlap in a planar view.

"Display device" refers to a structure that displays an image using an electro-optic layer. For example, the term "display device" may refer to a display panel including an electro-optical layer, or a structure in which another optical member (for example, a polarizing member, a backlight, a touch panel, or the like) is attached to a display cell. The "electro-optic layer" may include a liquid crystal layer, an electroluminescence (EL) layer, an electrochromic (EC) layer, and an electrophoretic layer as long as no technical contradiction occurs. Therefore, the embodiments described later will be described by exemplifying a liquid crystal display device including a liquid crystal layer and an organic EL display device including an organic EL layer as a display device. The present invention can be applied to a display device including the electro-optic layer mentioned above.

In the present specification, the expressions "α includes A, B or C", "α includes any of A, B and C", and "α includes one selected from the group consisting of A, B and C" unless otherwise stated does not exclude the case where α includes a plurality of combinations of A to C. Furthermore, these expressions do not exclude the case where α includes other elements.

Furthermore, each of the following embodiments can be combined with each other as long as no technical contradiction occurs.

One of the subjects in an embodiment of the present invention is to achieve a highly reliable semiconductor device.

First Embodiment

A semiconductor device and a manufacturing method of the semiconductor device related to an embodiment of the present invention is explained using FIG. 1 to FIG. 13. The semiconductor device of the embodiments shown herein may also use an integrated circuit (IC) such as a microprocessing unit (MPU) or a memory circuit in addition to a semiconductor device such as a transistor used in a display device.

Structure of Semiconductor Device 10

Figure 2:
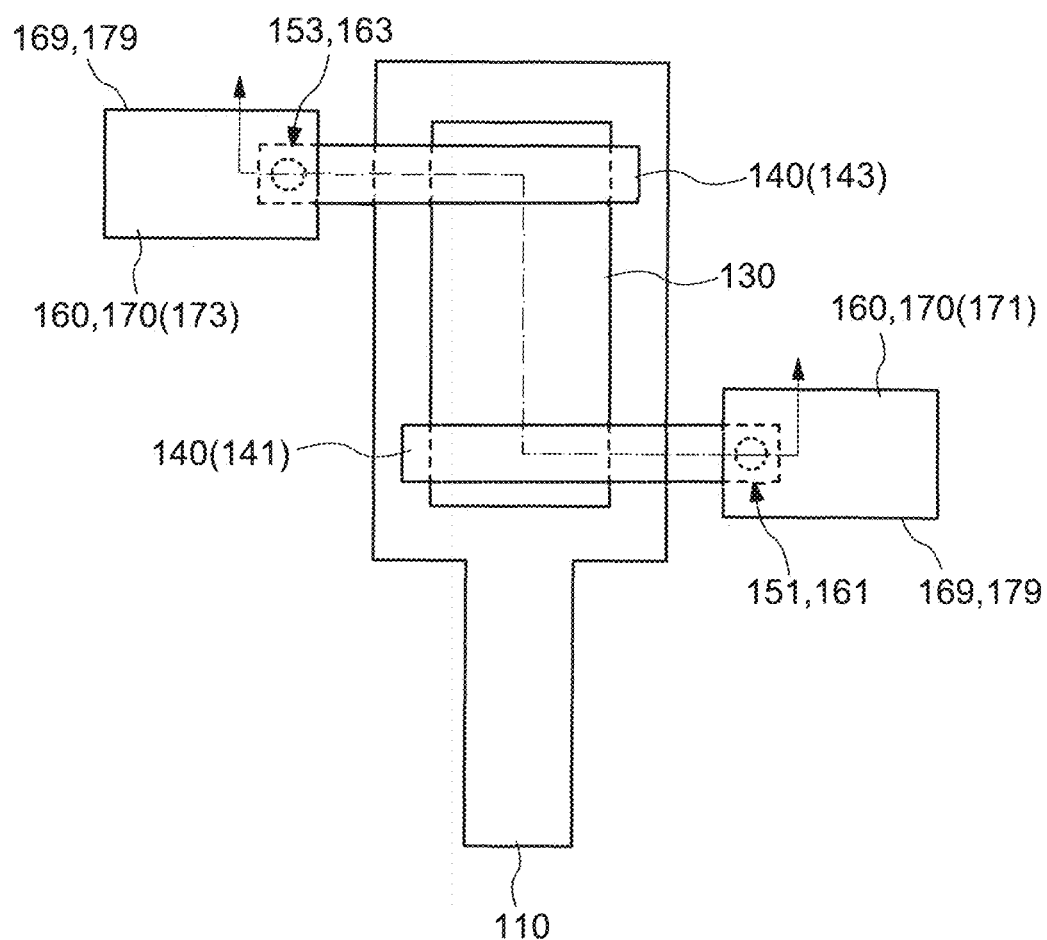
FIG. 2 is a planar view illustrating an outline of a semiconductor device according to an embodiment of the present invention.
Figure 3:
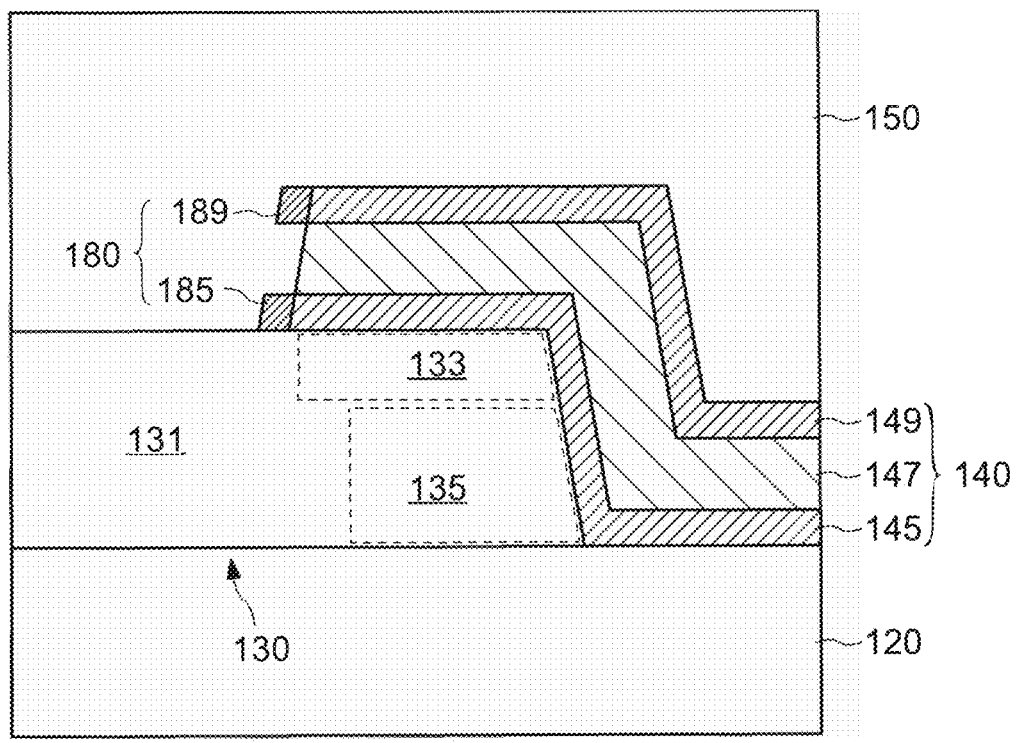
FIG. 3 is a partially enlarged cross-sectional view of a semiconductor device according to an embodiment of the present invention.

The structure of a semiconductor device 10 related to an embodiment of the present invention is explained using FIG. 1 to FIG. 3. FIG. 1 is a cross-sectional view illustrating an outline of a semiconductor device related to an embodiment of the present invention. FIG. 2 is a planar view illustrating an outline of the semiconductor device related to an embodiment of the present invention. FIG. 3 is a partially enlarged cross-sectional view of the semiconductor device related to an embodiment of the present invention.

As is shown in FIG. 1, the semiconductor device 10 is arranged above the substrate 100. The semiconductor device 10 includes a first gate electrode 110, a first gate insulating layer 120, a first oxide semiconductor layer 130, a first source electrode 141, a first drain electrode 143, a first insulating layer 150, an oxide layer 160, a first source wiring 171 and a first drain wiring 173. In the case when the first source electrode 141 and the first drain electrode 143 are not particularly distinguished, these electrodes may be referred to as a first electrode 140. In the case when the first source wiring 171 and the first drain wiring 173 are not particularly distinguished, these wirings may be referred to as the first conductive layer 170.

The first gate electrode 110 is arranged above the substrate 100. The first gate electrode 110 faces the first oxide semiconductor layer 130. The first gate insulating layer 120 is arranged between the first gate electrode 110 and the first oxide semiconductor layer 130. In the example of FIG. 1, the first gate electrode 110 and the first gate insulating layer 120 are arranged under the first oxide semiconductor layer 130. The first electrode 140 is arranged above the first gate insulating layer 120 and above the first oxide semiconductor layer 130. The first electrode 140 extends from the upper surface of the first gate insulating layer 120 to a pattern end of the first oxide semiconductor layer 130 and continues to the upper surface of the first oxide semiconductor layer 130. That is, the first electrode 140 is in contact with the first oxide semiconductor layer 130 from above the first oxide semiconductor layer 130.

As will be described in detail later, the first oxide semiconductor layer 130 is an indium-containing oxide semiconductor. The first oxide semiconductor layer 130 includes a channel region 131 between the first source electrode 141 and the first drain electrode 143. That is, at an end portion of the channel region 131, each of the first source electrode 141 and the first drain electrode 143 is in contact with the first oxide semiconductor layer 130. In below the first source electrode 141 and the first drain electrode 143 (a first region 133 and a second region 135 to be described later), inside the first oxide semiconductor layer 130, indium included in the first oxide semiconductor layer 130 is unevenly distributed. In other words, in the first oxide semiconductor layer 130 in a region overlapping with the first electrode 140 in planar view, indium included in the first oxide semiconductor layer 130 is unevenly distributed.

The first insulating layer 150 covers the first oxide semiconductor layer 130 and the first electrode 140. A first aperture 151 and a first aperture 153 are arranged in the first insulating layer 150. The first aperture 151 is an opening which reaches the first source electrode 141. The first aperture 153 is an opening which reaches the first drain electrode 143. The oxide layer 160 is arranged above the first insulating layer 150. The second apertures 161 and 163 are arranged in the oxide layer 160. The second aperture 161 is an opening which is continuous with the first aperture 151. The second aperture 163 is an opening which is continuous with the first aperture 153.

A first conductive layer 170 is arranged above the oxide 160 and inside the first apertures 151, 153. In planar view, the first conductive layer 170 is arranged in the same region as the oxide layer 160, except the region where the first apertures 151, 153 exist. In a planar view, the oxide layer 160 does not exist in a region where the first conductive layer 170 does not exist, and the first insulating layer 150 is exposed from the oxide layer 160. The first conductive layer 170 is in contact with the first electrode 140 at the bottom of the first apertures 151, 153. The first wiring 170 is electrically connected to the first oxide semiconductor layer 130 via the first electrode 140.

In the present embodiment, an example of a configuration in which a bottom gate transistor configured with the gate electrode arranged below the oxide semiconductor layer is used as the semiconductor device 10, but the embodiment is not limited to this configuration. For example, a top gate transistor configured with the gate electrode arranged above the oxide semiconductor layer may be used as the semiconductor device 10.

As is shown in FIG. 2, the first oxide semiconductor layer 130 is arranged on the inner side of the first gate electrode 110 in a planar view. In particular, the first oxide semiconductor layer 130 is arranged on the inner side of the first gate electrode 110 in a region where the channel of the semiconductor device 10 is formed. In other words, the outer edge of the pattern of the first oxide semiconductor layer 130 is surrounded by the outer edge of the pattern of the first gate electrode 110 in a planar view. The first electrode 140 crosses the first oxide semiconductor layer 130 in a planar view. In other words, the first electrode 140 intersects the first oxide semiconductor layer 130. The second aperture 161 overlaps the first aperture 151 in a planar view. The second aperture 163 overlaps the first aperture 153 in a planar view. Indium included in the first oxide semiconductor layer 130 is unevenly distributed in the first oxide semiconductor layer 130 in a region overlapping with the first electrode 140 in a planar view. The structure described above is merely one embodiment, and the present invention is not limited to the structure described above.

FIG. 3 is an enlarged view of a region surrounded by a dotted line frame in FIG. 1. As is shown in FIG. 3, the first electrode 140 has a first conductive layer 145, a second conductive layer 147, and a third conductive layer 149 in the present embodiment. An oxide portion 180 is arranged at a pattern end of the first electrode 140. The oxide portion 180 is arranged above the first oxide semiconductor layer 130. The oxide portion 180 is an oxide of the first electrode 140. Specifically, the oxide portion 180 includes a first oxide portion 185 and a third oxide portion 189. The first oxide portion 185 is arranged at an end portion of the first conductive layer 145 which is an oxide of the first conductive layer 145. The third oxide portion 189 is arranged at an end portion of the third conductive layer 149 which is an oxide of the third conductive layer 149. The first oxide portion 185 has a conductivity. Further, the first oxide portion 185 is located on the channel region 131 side than a pattern end of the second conductive layer 147.

In the present embodiment, although the structure in which an oxide of the second conductive layer 147 is not arranged is exemplified, a second oxide portion which is an oxide of the second conductive layer 147 may be arranged on the end portion of the second conductive layer 147 between the first oxide portion 185 and the third oxide portion 189. Detail will be described later, although the second oxide portion is formed during the manufacturing process of the semiconductor device 10 in the present embodiment, the second oxide portion is removed in a subsequent process, therefore the structure shown in FIG. 3 is formed. The first oxide portion 185 may not have a conductivity.

The first oxide semiconductor layer 130 is arranged with a channel region 131, a first region 133, and a second 135. Most of the channel region 131 is a region where the first electrode 140 is not arranged above the first oxide semiconductor layer 130. The oxide portion 180 is arranged above the first oxide semiconductor layer 130 of the channel region 131. That is, the oxide portion 180 overlaps the region 131 in a planar view. Around the end portion of the oxide portion 180 side of the first electrode 140 is overlapped with a portion of the channel region 131 in a planar view. However, the first electrode 140 may not overlap with the channel region 131 in a planar view.

The first region 133 and the second region 135 are regions where the first electrode 140 is arranged above the first oxide semiconductor layer 130. In other words, the channel region 131 is a region where the first oxide semiconductor layer 130 is exposed from the first electrode 140 in a planar view. The first region 133 and the second region 135 are regions where the first oxide semiconductor layer 130 overlaps with the first electrodes 140 in a planar view. The oxide portion 180 is not arranged above the first oxide semiconductor layer 130 of the first region 133 and the second region 135. The first region 133 is arranged substantially an entire area where the first oxide semiconductor layer 130 overlaps the first electrode 140. On the other hand, the second region 135 is arranged at a position farther from the oxide portion 180 compared to the first region 133 in a planar view. That is, there is a region where the second region 135 is not arranged below the first electrodes 140.

The channel region 131, the first region 133, and the second region 135 are each formed from one oxide semiconductor layer. These regions are the same composition and the same crystalline state immediately after the oxide semiconductor layer is deposited. However, the compositions and crystalline states of the first oxide semiconductor layer 130 in each region differ depending on the effect of the manufacturing process of the semiconductor device 10.

In the first oxide semiconductor layer 130 in the first region 133 and the second region 135, indium included in the first oxide semiconductor layer 130 is unevenly distributed. On the other hand, in the first oxide semiconductor layer 130 in the channel region 131, indium is not unevenly distributed. The presence or absence of unevenly distributed indium in the first oxide semiconductor layer 130 may vary depending on a method of measurement and an accuracy of measurement. When it is determined that indium is unevenly distributed in the first oxide semiconductor layer 130 in the channel region 131, the degree (or amount) of uneven distribution of indium in the first oxide semiconductor layer 130 in the channel region 131 is larger than the degree (or amount) of uneven distribution of indium in the first oxide semiconductor layer 130 in the first region 133 and the second region 135. Further, the degree of uneven distribution of indium in the first oxide semiconductor layer 130 in the second region 135 is larger than the degree of uneven distribution of indium in the first oxide semiconductor layer 130 in the first region 133.

Here, a large degree of uneven distribution of indium means that a size of region (high density region) where indium density is higher than the other region, or a size (or crystalline particle size) of crystallized indium is larger than the other region.

The degree of uneven distribution of indium can be determined by, for example, a cross-sectional TEM (Transmission Electron Microscope) image, a cross-sectional STEM (Scanning Transmission Electron Microscope) image, or a cross-sectional SEM (Scanning Electron Microscope) image. For example, when a contrast of the first oxide semiconductor layer 130 in the channel region 131 is larger than a contrast of the first oxide semiconductor layer 130 in the first region 133 and the second region 135, it can be determined that the degree of uneven distribution of indium in the first region 133 and the second region 135 is larger than the degree of uneven distribution of indium in the channel region 131.

Alternatively, when a size of a mass of "bright" portion or "dark" portion in the contrast in the cross-sectional image mentioned above are relatively large, it can be determined that the degree of uneven distribution of indium is large. Alternatively, for example, in mapping analysis (plane analysis) of EDX (Energy Dispersive X-ray spectrometry) using SEM or STEM, when a signal strength due to indium is larger than the other region, that is, in the case where a region with dense indium is relatively larger than the other region, the degree of uneven distribution of indium can be determined to be large.

In the process leading to the present invention, when the second region 135 exists near the channel region 131 (near pattern end of the first electrode 140), it was found that a rise in an ON current of the semiconductor device 10 becomes slow. In addition, it is found that the second region 135 travels further towards the channel region 131 and that the rise in the ON current of the semiconductor device 10 becomes even slower by a stress of reliability test which measures NBTIS (Negative Bias Thermal Illumination Stress). This problem is not a commonly known problem, but a problem newly found by the inventor in the process leading to the present invention.

The cause of this is considered as follows. For example, in IGZO, it is known that a conductive path is formed by 5 s orbits of indium. It is considered that, when a composition of IGZO is biased with uneven distribution of indium as in the case of the second region 135, the conductive path is interrupted and resistance of IGZO film increases. For this reason, the rise in ON current of the semiconductor device 10 becomes slow.

The inventor has found that the above-mentioned problems can be solved by arranging the oxide portion 180 on the pattern end of the first electrodes 140. As will be described later, the oxide portion 180 is arranged on the pattern end of the first electrode 140, it was found that the problem that the rise of the ON current of the semiconductor device 10 becomes slow after the stress test is solved.

Material of Each Member of the Semiconductor Device 10

A substrate including a resin such as a polyimide substrate, an acrylic substrate, a siloxane substrate or a fluororesin substrate can be used as the substrate 100. That is, it is possible to use a flexible substrate having flexibility as the substrate 100. Impurities may also be introduced into the resin described above in order to improve heat resistance of the substrate 100. In particular, in the case when the semiconductor device 10 is a top emission type display, it is not necessary that the substrate 100 be transparent. Therefore, it is possible to use impurities which do not deteriorate the transparency of the substrate 100. On the other hand, in the case when the substrate 100 does not need flexibility, a rigid substrate which has translucency but does not have flexibility such as a glass substrate, a quartz substrate and a sapphire substrate can be used as the substrate 100. In the case where the semiconductor device 10 is used for an integrated circuit which is not a display device, it is possible to use a silicon substrate, a silicon carbide substrate, or a compound semiconductor substrate, or a substrate which does not have translucency such as a conductive substrate such as a stainless steel substrate as the substrate 100.

It is possible to use a general metal material as the first gate electrode 110, the first electrode 140, and the first conductive layer 170. For example, it is possible to use aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag) or an alloy or compound of these materials as these members. Each of the first gate electrode 110, the first electrode 140, and the first conductive layer 170 may be a single layer or may be a stacked layer of the materials described above.

For example, in the first electrode 140, an oxide of metal element constituting the first conductive layer 145 in contact with the first oxide semiconductor layer 130 is more stable than an oxide of metal element constituting the first oxide semiconductor layer 130. That is, when there are a plurality of metal elements constituting the first oxide semiconductor layer 130, it is preferable that a Gibbs free energy ($\Delta G_f$) of an oxide of metal element constituting the first conductive layer 145 in contact with the first oxide semiconductor layer 130 is smaller than a Gibbs free energy of the metal oxide of each of the plurality of metal elements.

For example, when IGZO is used as the first oxide semiconductor layer 130, Ti may be used as a metal in contact with the IGZO. The Gibbs free energy of indium oxide is greater than the Gibbs free energy of each of Ga oxide and Zn oxide. Thus, indium oxide is chemically unstable and easily reduced. On the other hand, since the Gibbs free energy of Ti oxide is sufficiently smaller than the Gibbs free energy of each of Ga oxide and Zn oxide, when Ti is formed on IGZO, Ti combines with oxygen in IGZO to form Ti oxide. Since indium oxide is easily reduced as described above, when high-energy is supplied in a state in which IGZO and Ti are in contact with each other, indium oxide is reduced and Ti is oxidized. For the semiconductor device 10, when Ti is depositioned on IGZO, resistance of IGZO is reduced because Ti deprives oxygen from upper part of IGZO (the first region 133) and IGZO in the first region 133 becomes a n-type. This phenomena reduces resistance between IGZO and Ti. On the other hand, when a high-temperature heat treatment is performed in a step after the first electrodes 140 is formed on the first oxide semiconductor layer 130, uneven distribution of indium region is formed in the first oxide semiconductore layer 130 (particularly, the second region 135).

As the first gate insulating layer 120 and the first insulating layer 150, a common insulating material can be used. For example, as to these insulating layers, it is possible to use such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$) and the like inorganic insulating layer can be used. These insulating layer may be used with a low-defect insulating layer. For example, when a composition ratio of oxygen in the first insulating layer 150 is compared with a composition ratio of oxygen in insulating layer (hereinafter referred to as "other insulating layer") having the same composition as that of the first insulating layer 150, the composition ratio of oxygen in the first insulating layer 150 is closer to stoichiometric ratio of insulating layer having the same composition as that of the first insulating layer 150 than the composition ratio of oxygen in the other insulating layer.

$SiO_xN_y$ and $AlO_xN_y$ described above are a silicon compound and an aluminum compound containing nitrogen (N) at a smaller amount than oxygen (O) (the x is larger than the y). In addition, $SiN_xO_y$ and $AlN_xO_y$ are a silicon compound and an aluminum compound containing oxygen at a smaller amount than nitrogen (the x is larger than the y).

It is possible to use a metal oxide having semiconductor characteristics as the first oxide semiconductor layer 130. For example, it is possible to use an oxide semiconductor containing indium (In), gallium (Ga), zinc (Zn), and oxygen (O) as the first oxide semiconductor layer 130. In particular, it is possible to use an oxide semiconductor having a composition ratio of In:Ga:Zn:O=1:1:1:4 as the first oxide semiconductor layer 130. However, the oxide semiconductor which is used in this embodiment and includes In, Ga, Zn, and O is not limited to the composition described above. It is possible to use an oxide semiconductor having a composition different from that described above as the oxide semiconductor. For example, the In ratio may be increased more than the ratio described above in order to improve mobility. In addition, in order to increase the band gap and reduce the influence of light irradiation, the Ga ratio may also be increased more than the ratio described above.

Other elements may also be added to the oxide semiconductor containing In, Ga, Zn, and O. For example, a metal element such as Al or Sn may be added to the oxide semiconductor. In addition to the oxide semiconductors described above, an oxide semiconductor containing In and Ga (IGO), an oxide semiconductor containing In and Zn (IZO), an oxide semiconductor containing In, Sn and Zn (ITZO), and an oxide semiconductor containing In and W and the like can be used for the first oxide semiconductor layer 130. The first oxide semiconductor layer 130 may be amorphous or crystalline. The first oxide semiconductor layer 130 may also be a mixed phase of amorphous and crystalline.

It is possible to use an oxide semiconductor layer having the same composition as the first oxide semiconductor layer 130, an oxide conductive layer such as ITO, or an oxide insulating layer such as $SiO_x$, $SiO_xN_y$, $AlO_x$, and $AlO_xN_y$ as the oxide layer 160. The oxide layer 160 is preferred to be formed by a sputtering method. In the case where the oxide layer 160 is formed by a sputtering method, a process gas which is used in the sputtering may sometimes remain in the oxide layer 160 film. For example, in the case when argon (Ar) is used as the sputtering process gas, Ar remains within the oxide layer 160 film. The remaining Ar can be detected in the oxide layer 160 by SIMS (Secondary Ion Mass Spectrometry) analysis. In the case where an oxide insulating layer having the same composition as the material which is used for the first insulating layer 150 is used as the oxide layer 160, the composition ratio of oxygen in the oxide layer 160 is larger than the composition ratio of oxygen in the first insulating layer 150.

Method for Manufacturing Semiconductor Device 10

Referring to FIG. 4 to FIG. 7, a method for manufacturing the semiconductor device 10 according to an embodiment of the present invention will be described. FIG. 4 to FIG. 7 are a cross-sectional view illustrating a method for manufacturing a semiconductor device according to an embodiment of the present invention. In the following explanation of the manufacturing process, Ti is used as the first conductive layer 145 and the third conductive layer 149, and Al is used as the second conductive layer 147.

Figure 4:
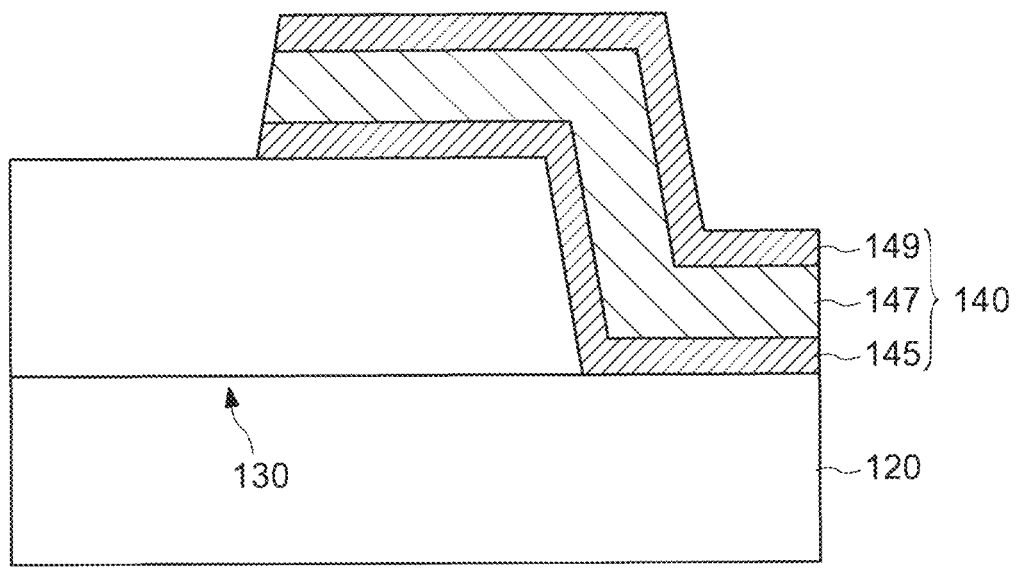
FIG. 4 is a cross-sectional view illustrating a method for manufacturing a semiconductor device according to an embodiment of the present invention.

As shown in FIG. 4, a pattern of the first oxide semiconductor layer 130 is formed on the first gate insulating layer 120 arranged on the first gate electrode 110 (refer FIG. 1), and a pattern of the first electrode 140 is formed. A pattern end of the first electrode 140 is located above the first oxide semiconductor layer 130. Since a general semiconductor process can be used for the manufacturing method up to the structure shown in FIG. 4, a detailed description thereof is omitted.

Figure 5:
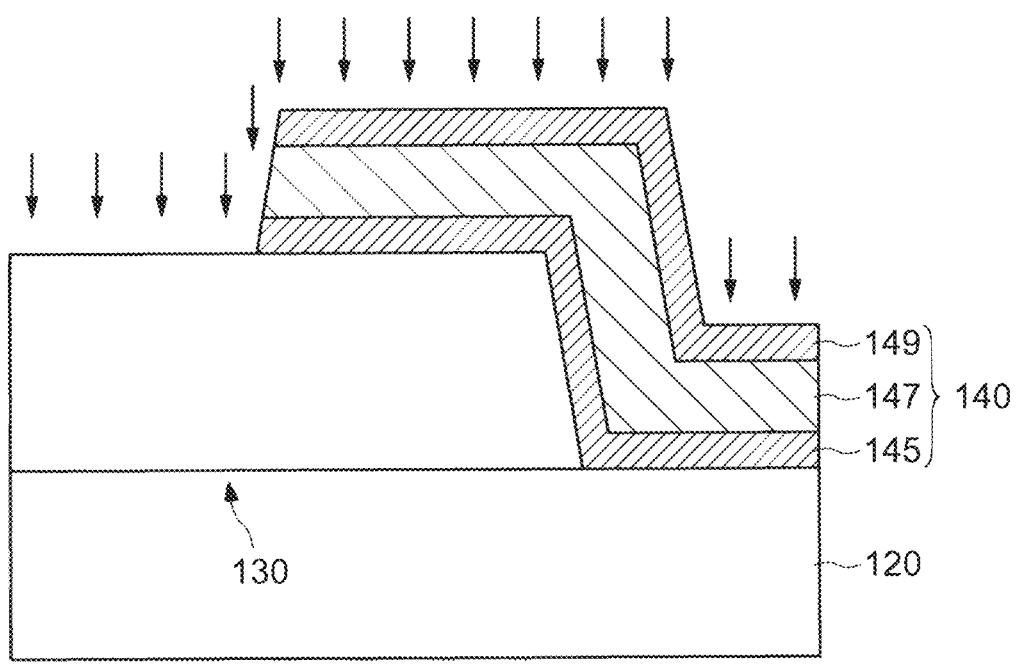
FIG. 5 is a cross-sectional view illustrating a method for manufacturing a semiconductor device according to an embodiment of the present invention.

Next, as shown in FIG. 5, a plasma treatment using oxygen is performed on the first oxide semiconductor layer 130 and the first electrodes 140. In the present embodiment, performing a plasma treatment using $N_2O$ gas (hereinafter, referred to as "$N_2O$ plasma treatment") as the plasma treatment. In other words, $N_2O$ plasma treatment is performed to at least the pattern end of the first electrode 140.

Figure 6:
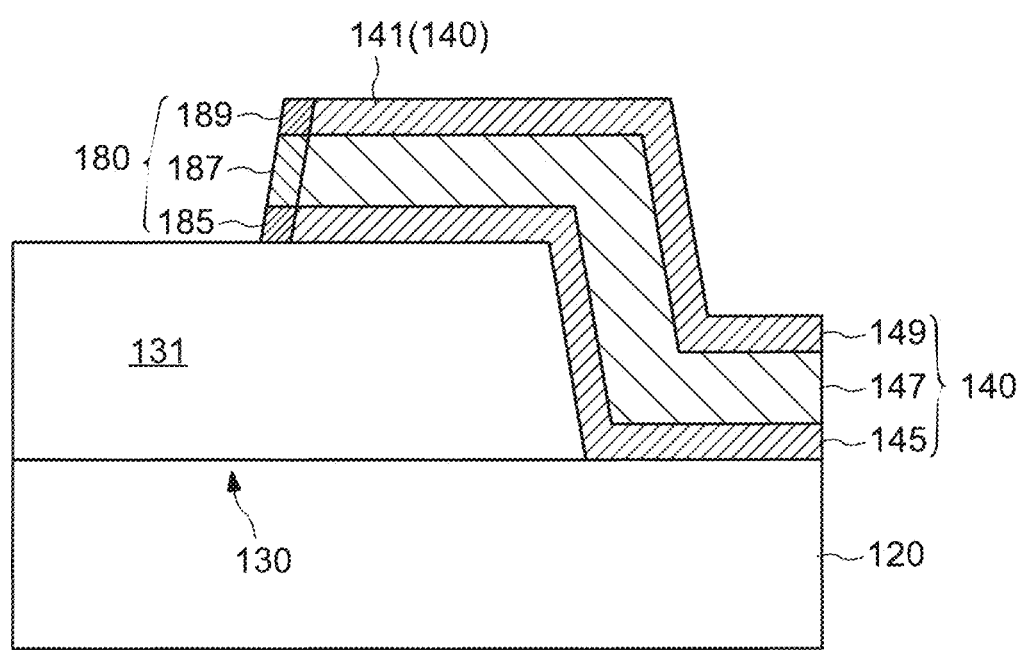
FIG. 6 is a cross-sectional view illustrating a method for manufacturing a semiconductor device according to an embodiment of the present invention.

As shown in FIG. 6, an oxide portion 180 is formed on the end portion of the first electrode 140 by $N_2O$ plasma treatment. Specifically, a first oxide portion 185 is formed on the end portion of the first conductive layer 145, a second oxide portion 187 is formed on the end portion of the second conductive layer 147, and a third oxide portion 189 is formed on end portion of the third conductive layer 149. The upper portion of the third conductive layer 149, which is the uppermost layer of the first electrode 140, is also oxidized by $N_2O$ plasma treatment, but the oxidized part is omitted for convenience of explanation.

Figure 7:
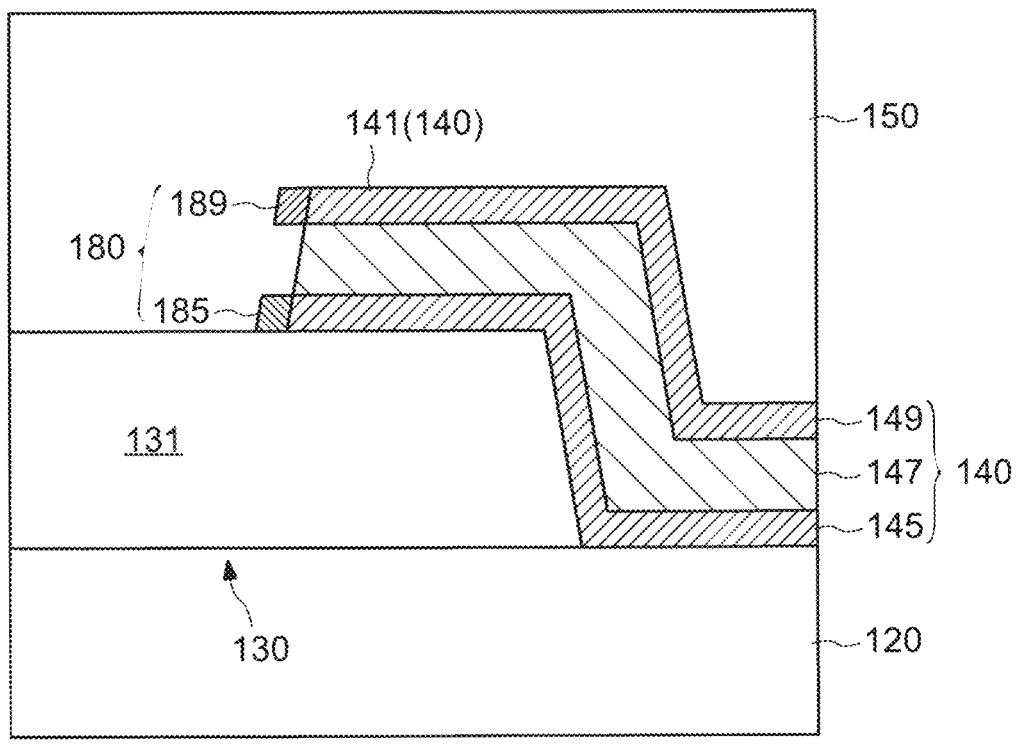
FIG. 7 is a cross-sectional view illustrating a method for manufacturing a semiconductor device according to an embodiment of the present invention.

The second oxide portion 187 of the oxide portion 180 disappears during the process forming the first insulating layer 150 covering the first electrodes 140. As a result, only the first oxide portion 185 and the third oxide portion 189 remain on the end portion of the first electrodes 140 as shown in FIG. 7.

In the present embodiment, an example in which all of the second oxide portion 187 disappear is described, but a part of the second oxide portion 187 may remain. The second oxide portion 187 may not disappear and may be in the condition of FIG. 6.

By performing a heat treatment after forming the first insulating layer 150 described above, indium is segregated (uneven distribution of indium is formed) in the first oxide semiconductor layer 130 in a region overlapping with the first electrode 140 in a planar view.

Uneven Distribution of Indium in First Oxide Semiconductor Layer 130

FIG. 8 to FIG. 13 will be described with reference to uneven distribution of indium in the channel region 131, the first region 133, and the second region 135 of the first oxide semiconductor layer 130. The cross-sectional image of the semiconductor device 10 shown in FIG. 8 to FIG. 13 is a cross-sectional image of the sample prior to performing the reliability test after manufacturing the semiconductor device 10.

Figure 8:
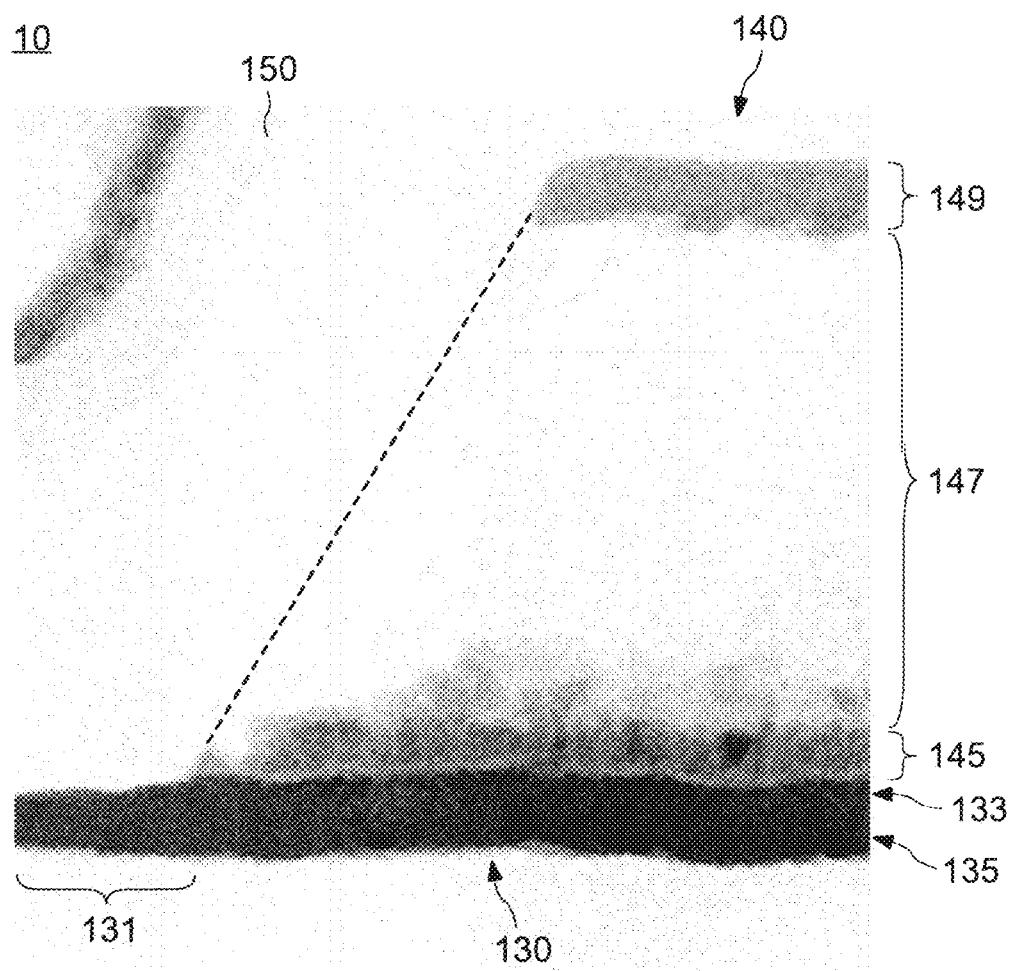
FIG. 8 is a cross-sectional TEM image of a semiconductor device according to an embodiment of the present invention.

FIG. 8 is a cross-sectional TEM image of a semiconductor device according to an embodiment of the present invention. In FIG. 8, similarly to the above, a structure in which Ti is used as the first conductive layer 145 and the third oxide semiconductor layer 149, Al is used as the second conductive layer 147, and IGZO is used as the first oxide semiconductore layer 130 is shown. The first conductive layer 145 (Ti) and the third conductive layer 147 (Al) have different patterns in a cross-sectional views due to different crystalline states. In the first oxide semiconductor layer 130, a region in which the first electrode 140 is not arranged above thereof corresponds to the channel region 131, and a region in which the first electrode 140 is arranged above thereof corresponds to the first region 133 and the second region 135. Mixed crystal region is formed in which Ti and Al are reacted between the first conductive layer 145 and the second 147.

In FIG. 8, the dotted line connecting the first conductive layer 145 and the third conductive layer 149 is a portion which is presumed that the end portion of the second 147 was existed based on the shapes of these conductive layers. As described above, at least a portion of the second conductive layer 147 disappears, and shapes shown in FIG. 8 is formed.

Figure 9:
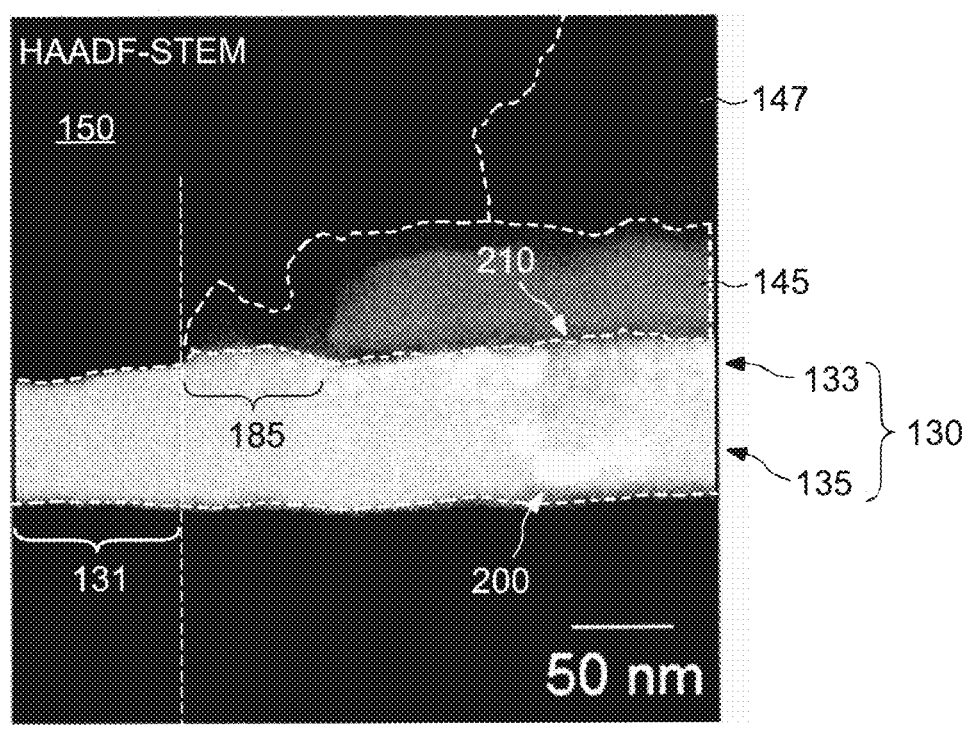
FIG. 9 is a cross-sectional HAADF-STEM image of a semiconductor device according to an embodiment of the present invention.
Figure 10:
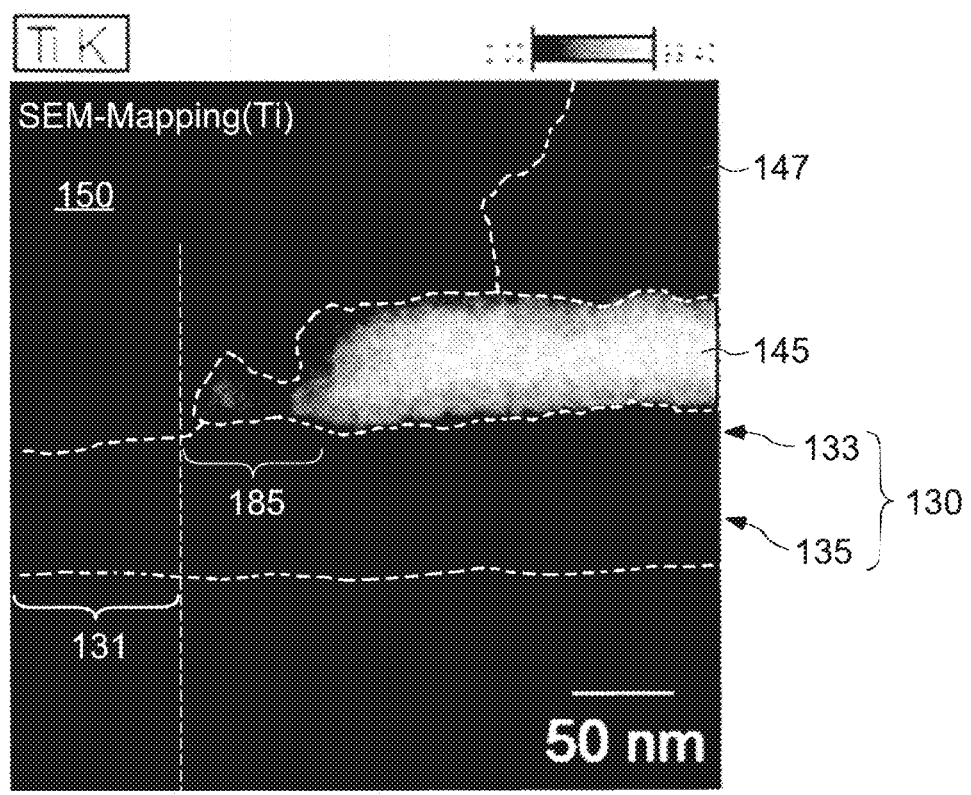
FIG. 10 is an EDX mapping measurement result of a semiconductor device according to an embodiment of the present invention.
Figure 11:
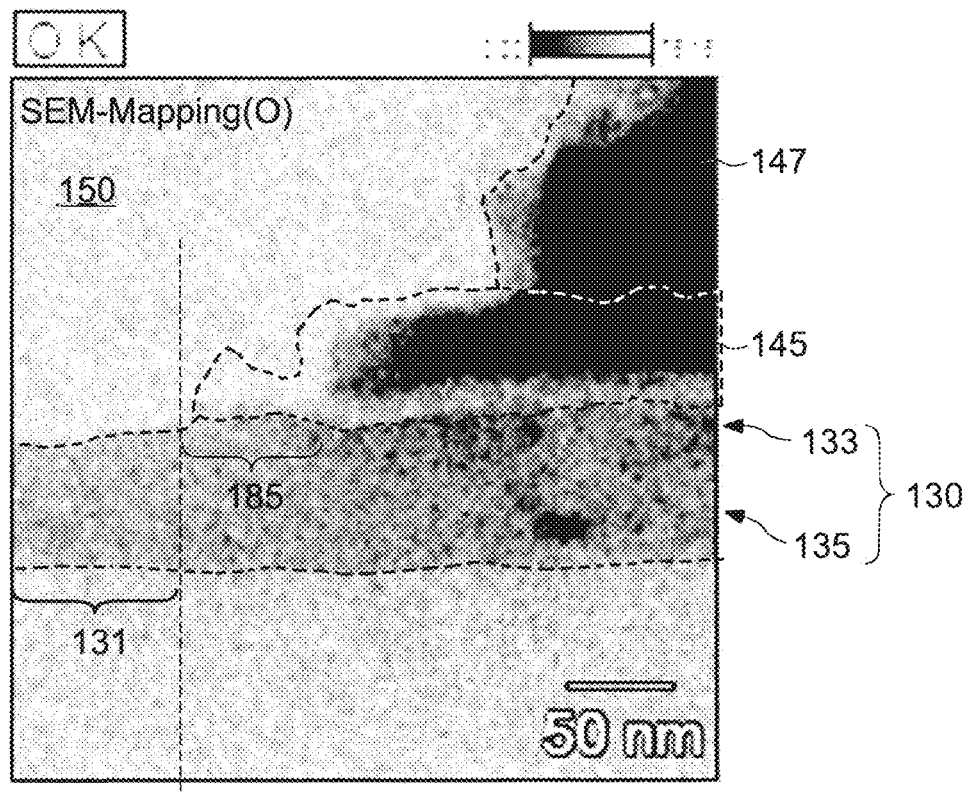
FIG. 11 is an EDX mapping measurement result of a semiconductor device according to an embodiment of the present invention.
Figure 12:
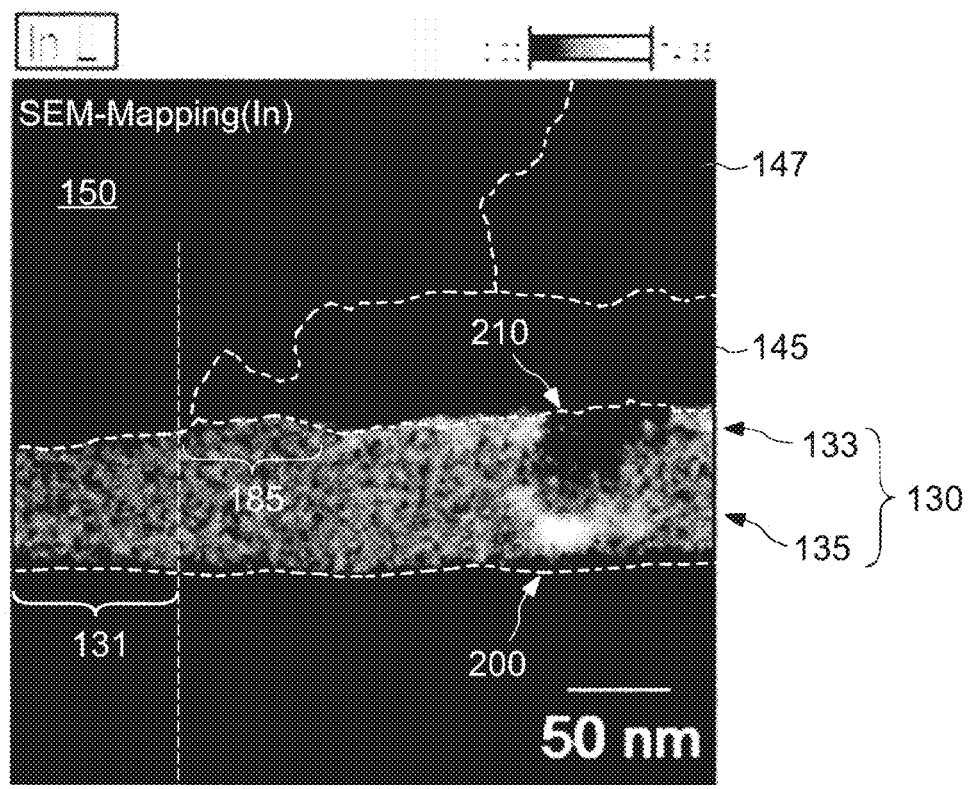
FIG. 12 is an EDX mapping measurement result of a semiconductor device according to an embodiment of the present invention.
Figure 13:
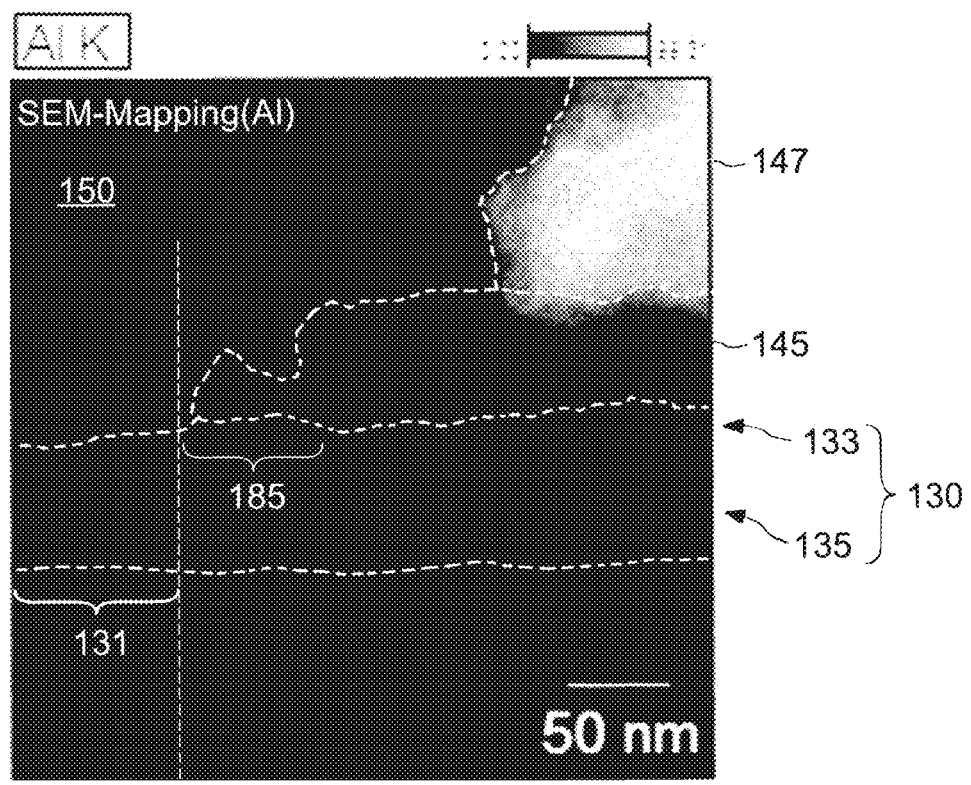
FIG. 13 is an EDX mapping measurement result of a semiconductor device according to an embodiment of the present invention.

FIG. 9 is a cross-sectional HAADF (High-Angle Annular Dark Field)-STEM image of a semiconductor device according to an embodiment of the present invention. FIG. 9 is an enlarged STEM image of a portion of FIG. 8. In FIG. 9, a portion of the first oxide semiconductor layer 130, the first conductive layer 145, and the second conductive layer 147 is shown. FIG. 10 to FIG. 13 are EDX-mapping measurements of the semiconductor device according to an embodiment of the present invention, respectively. FIG. 10 shows an EDX-mapping measurement result of Ti. FIG. 11 shows an EDX-mapping measurement result of O. FIG. 12 shows an EDX-mapping measurement result of In. FIG. 13 shows an EDX-mapping measurement result of Al. In each of the figure, regions where the first oxide semiconductor layer 130, the first conductive layer 145, and the second conductive layer 147 are arranged are shown in a dotted line.

Referring to FIG. 9 to FIG. 11, although Ti is detected from a region surrounded by a dotted line showing the first conductive layer 145, near the left end of the dotted line, the signal strength of Ti is smaller and the signal strength of oxygen is larger than that of the other region. That is, the first oxide portion 185 (Ti oxide) is formed on the left end of the first conductive layer 145. The first oxide portion 185 has a partially missing shape, which is a concave shape in the present embodiment. From FIG. 10 and FIG. 11, oxygen is detected from the lower region of the first conductive layer 145. That is, Ti oxide is formed under Ti.

Referring to FIG. 9 and FIG. 12, a region that is brighter than the other region (hereinafter referred to as a "bright region 200") in the contrast of STEM image of FIG. 9 is a region where indium density is higher than the other region as shown in FIG. 12. A region that is darker than the other region in FIG. 9 (hereinafter referred to as a "dark region 210") is a region where indium density is lower than the other region as shown in FIG. 12.

As shown in FIG. 9, the size of the mass of the bright region 200 in the second region 135 is larger than the size of the mass of the bright region 200 in the first region 133. In FIG. 9, it is determined that uneven distribution of indium is not formed, because no clear mass of the bright region 200 and the dark region 210 are identified in the channel region 131. A small-sized bright region is confirmed in the first region 133, but it is considered that oxygen of the oxide semiconductor is reduced at the surface layer of the first oxide semiconductor layer 130 at the time of Ti film deposition or in a precess after the Ti film deposition, and a region where indium density is high is partially formed. It is considered that the oxide semiconductor became n-type by reducing oxygen in the surface layer of the first oxide semiconductor layer 130. On the other hand, in the first oxide semiconductor layer 130 in the first region 133 and the second region 135, since the bright region 200 and the dark region 210 are localized, it is determined that uneven distribution of indium is formed.

In other words, the degree of the uneven distribution of indium mentioned above, the degree of the uneven distribution of indium in the first oxide semiconductor layer 130 in the first region 133 and second region 135 is larger than the degree of the uneven distribution of indium of the first oxide semiconductor layer 130 in the channel region 131. That is, in a planar view, the degree of the uneven distribution of indium in the first oxide semiconductore layer 130 in a region overlapping with the first oxide portion 185 is smaller than the degree of the uneven distribution of indium in the first oxide semiconductor layer 130 in a region overlapping with the first electrode 140. In the above example, in a planar view, the uneven distribution of indium in the first oxide semiconductor layer 130 in a region overlapping with the first oxide portion 185 is not formed. The degree of the uneven distribution of indium in the first oxide semiconductor layer 130 in the second region 135 is larger than the degree of the uneven distribution of indium in the first oxide semiconductor layer 130 in the first region 133. Here, it is considered that uneven distribution of indium is attributed to the crystallization of indium. Therefore, it can be said that, the crystalline particle size of the uneven distribution of indium in the first oxide semiconductor layer 130 in the second region 135 is larger than the crystalline particle size of the unevenly distributed indium in the first oxide semiconductor layer 130 in the first region 133.

As shown in FIG. 9 and FIG. 12, in the second region 135, a region where uneven distribution of indium is formed has not reached the end portion of the channel region 131 side of the first conductive layer 145. That is, in this condition, the rise problem of the ON current of the semiconductor device 10 does not occur.

Referring to FIG. 9, FIG. 11 and FIG. 13, a region in which oxygen is not detected and a region in which Al is detected substantially coincide with each other. That is, it is considered that almost Al oxide is not formed in the end portion of the second conductive layer 147. At least in the end portion of the second conductive layer 147, there is no Al oxide in the order of tens of nanometers. However, Al oxide in the order of a few or several nanometers (smaller than ten nanometers) may exist in the end portion of the second conductive layer 147.

Uneven Distribution of Indium in Comparative Examples

Comparative examples of the semiconductor device 10 according to the first embodiment will be described with reference to FIG. 14 to FIG. 19. A semiconductor device 10A of the comparative examples was produced without performing the above-described $N_2O$ plasma treatment. The structures of the first electrodes 140A and 140 are different when the semiconductor device 10A and the semiconductor device 10 are compared with each other, as described in detail below. The other points have almost common features. Across-sectional image of the semiconductor device 10A shown in FIG. 14 to FIG. 19 is a cross-sectional image of the sample prior to performing the reliability test after manufacturing the semiconductor device 10A.

Figure 14:
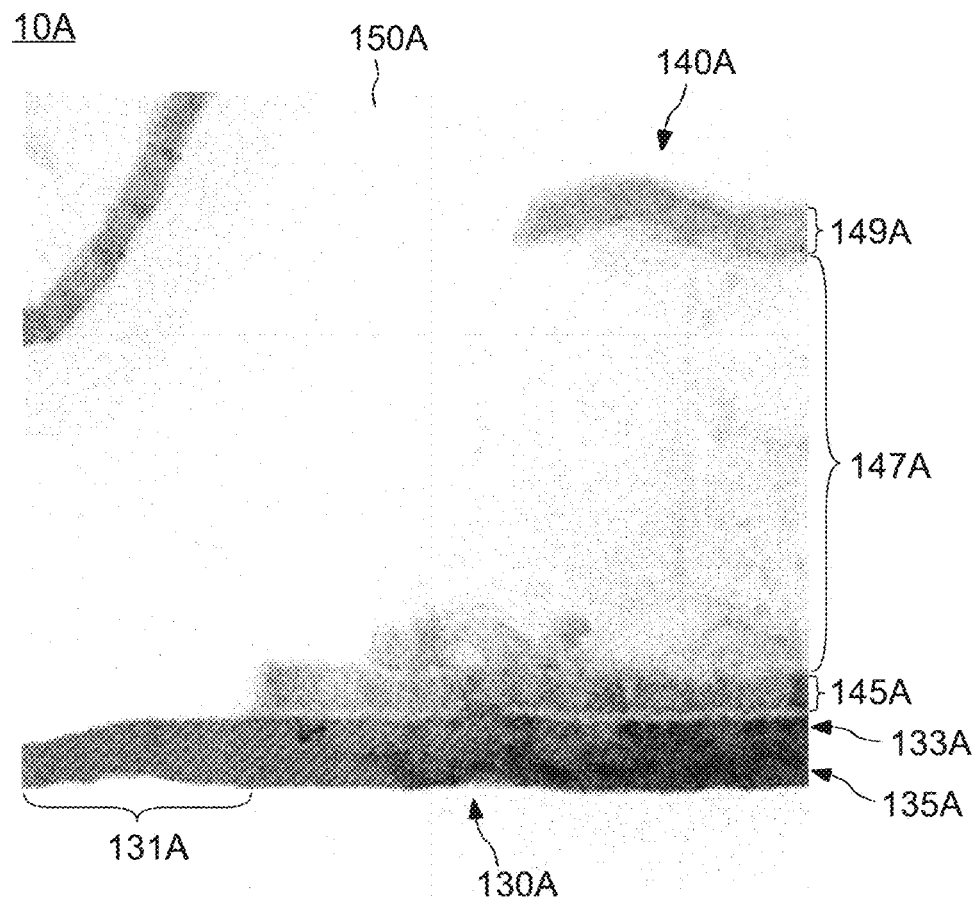
FIG. 14 is a cross-sectional TEM image of a semiconductor device according to a comparative example of the present invention.

FIG. 14 is a cross-sectional TEM image of a semiconductor device according to a comparative embodiment of the present invention. In the semiconductor device 10A shown in FIG. 14, similarly to the above, a structure in which Ti is used as a first conductive layer 145A and a third conductive layer 149A, Al is used as a second conductive layer 147A, and IGZO is used as a first oxide semiconductor layer 130A is shown.

Comparing the semiconductor device 10A shown in FIG. 14 and the semiconductor device 10 shown in FIG. 8, the second conductive layer 147 between the first conductive layer 145 and the third conductive layer 149 is recessed inward of the pattern of the first electrode 140 in the semiconductor device 10, but it is not configured like this in the semiconductor device 10A. In the semiconductor device 10A, end portions of the first conductive layer 145A, the second conductive layer 147A and the third conductive layer 149A are substantially aligned.

Figure 15:
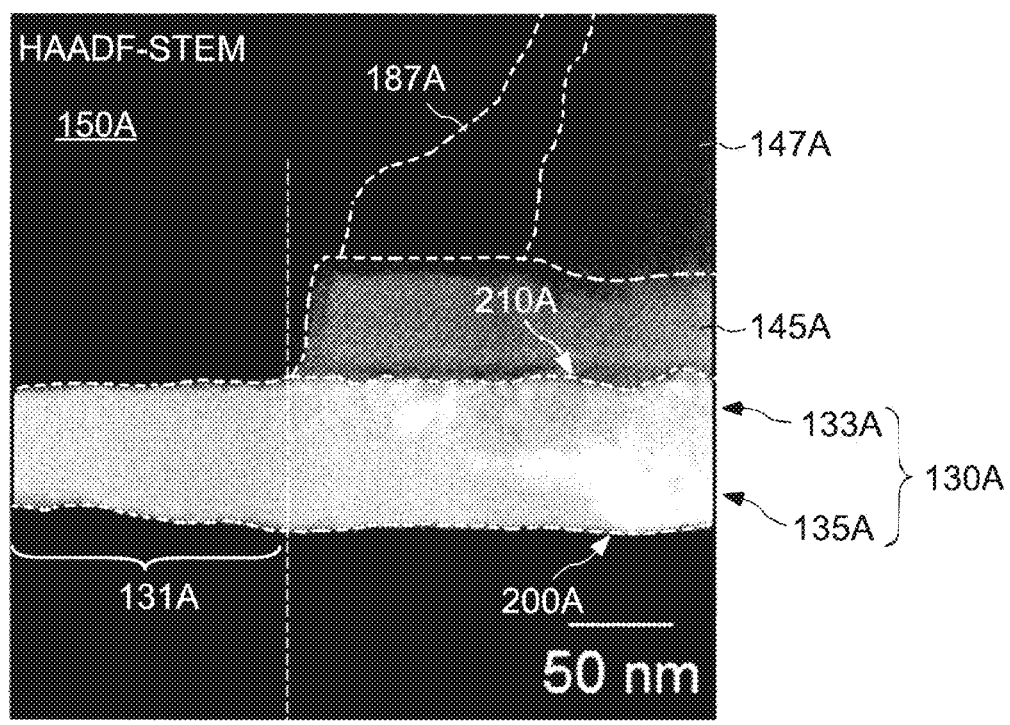
FIG. 15 is a cross-sectional HAADF-STEM image of a semiconductor device according to a comparative example of the present invention.

FIG. 15 is a cross-sectional HAADF-STEM image of a semiconductor device according to a comparative embodiment of the present invention. FIG. 15 is an enlarged STEM image of a portion of a region from FIG. 14. FIG. 16 to FIG. 19 show the EDX-mapping measurement result of the semiconductor device according to the comparative examples. FIG. 15 to FIG. 19 are diagrams corresponding to FIG. 9 to FIG. 13, respectively.

Figure 16:
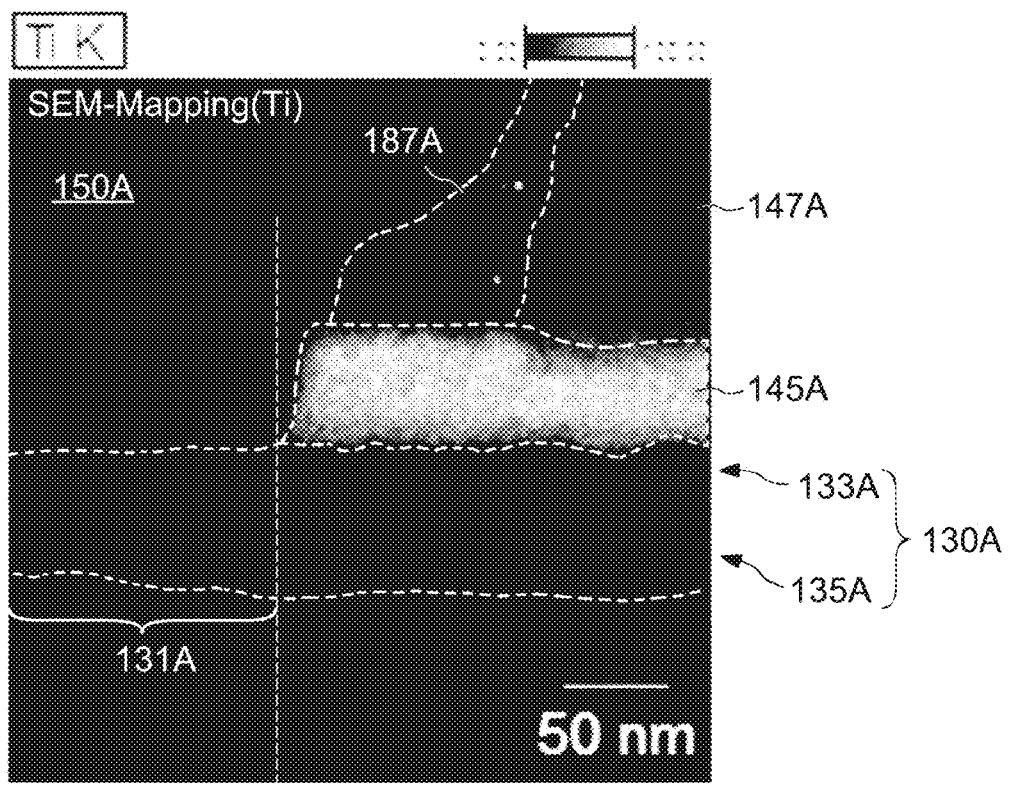
FIG. 16 is an EDX mapping measurement result of a semiconductor device according to a comparative example of the present invention.
Figure 17:
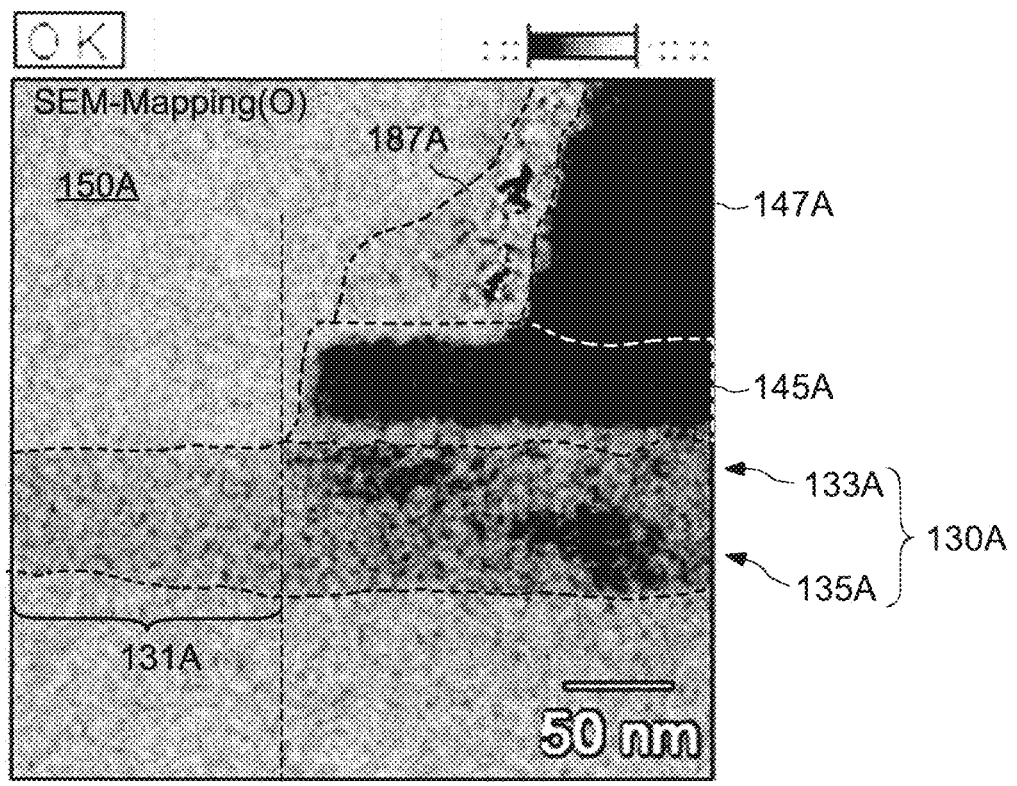
FIG. 17 is an EDX mapping measurement result of a semiconductor device according to a comparative example of the present invention.

Referring to FIG. 15 to FIG. 17, Ti is detected in a region surrounded by a dotted line indicating the first conductive layer 145A, and $O_2$ is not detected in the region. That is, the first oxide portion 185 as shown in FIG. 11 is not formed on the end portion of the first conductive layer 145A. The shape of the end portion of the first conductive layer 145A is different from the shape of the first oxide portion 185 of the first embodiment, and is a shape close to a portion of a rectangular shape.

Figure 18:
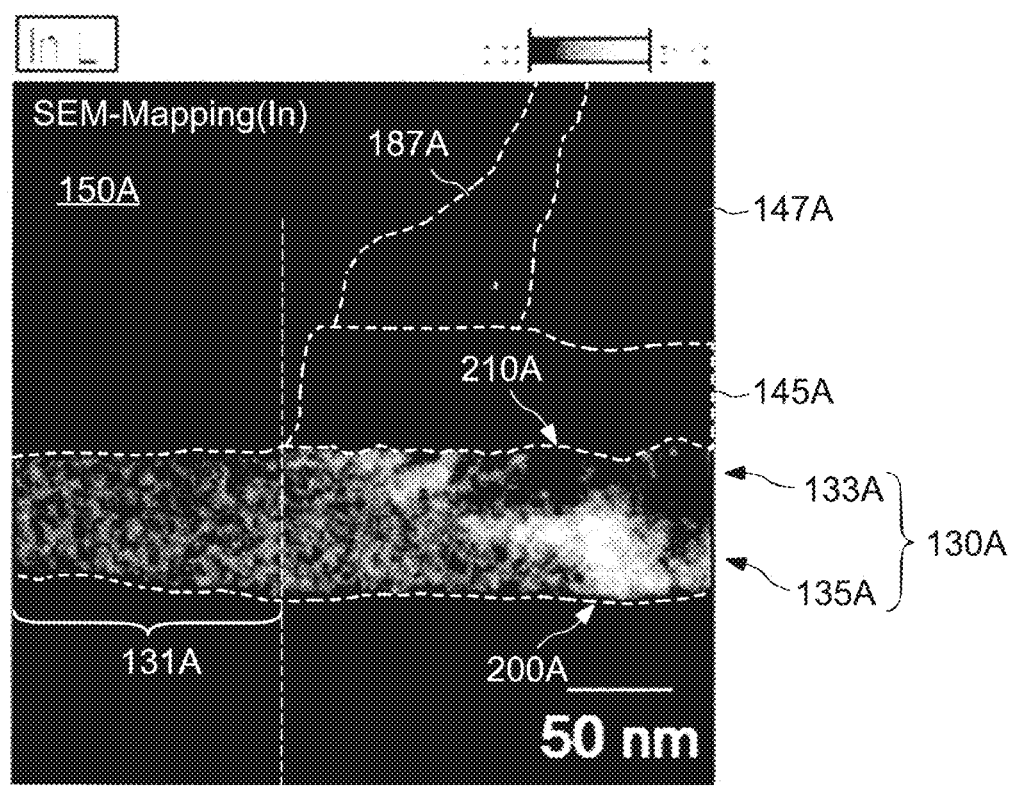
FIG. 18 is an EDX mapping measurement result of a semiconductor device according to a comparative example of the present invention.

Referring to FIG. 15 and FIG. 18, a bright region 200A and a dark region 210A are confirmed in a first region 133A and a second region 135A similar to FIG. 12 according to the first embodiment. The size of the mass of the bright region 200A in the second region 135A is larger than the size of the mass of the bright region 200A in the first region 133A. Similar to the first embodiment, in a channel region 131A, since the mass of the bright region 200A and the dark region 210A are not clearly confirmed, it is determined that uneven distribution of indium is not formed. In other words, the uneven distribution of indium does not differ significantly between the semiconductor device 10 according to the first embodiment and the semiconductor device 10A according to the comparative examples.

As shown in FIG. 15 and FIG. 18, in the second region 135A, a region where the uneven distribution of indium is formed does not reach the end portion of the channel region 131A side of the first conductive layer 145A. That is, in this condition, the phenomena that the rise of the ON current of the semiconductor device 10A as well as the semiconductor device 10 of the first embodiment becomes slow will not occur.

Figure 19:
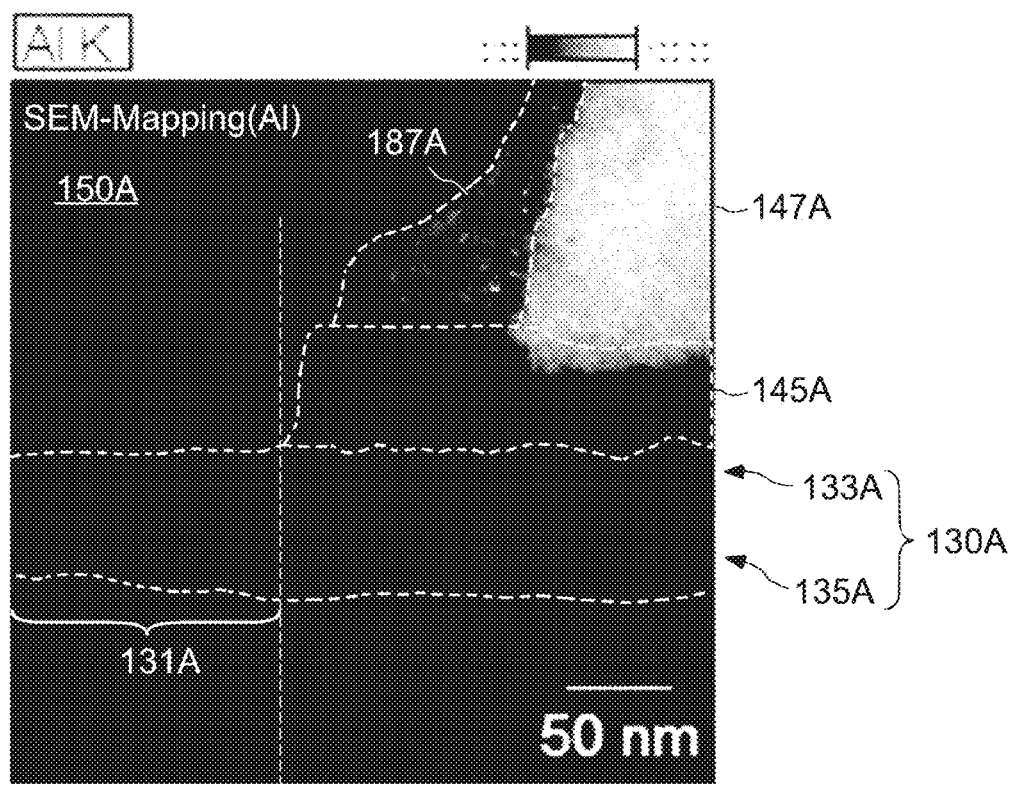
FIG. 19 is an EDX mapping measurement result of a semiconductor device according to a comparative example of the present invention.

Referring to FIG. 15, FIG. 17, and FIG. 19, in the end portion on the channel region 131A side of the second conductive layer 147A, there is a region in which the amount of Al is relatively small and oxygen is detected. That is, a second oxide portion 187A (Al oxide) is formed on end portion of the second conductive layer 147A.

Generation Process of Uneven Distribution Region of Indium in First Oxide Semiconductor Layer 130

An exemplary process is illustrated for generating process of uneven distribution region of indium. For example, uneven distribution region of indium is formed in the first oxide semiconductor layer 130 below the first electrode 140 by heating the first oxide semiconductor layer 130 below the first electrode 140 in a condition that the first insulating layer 150 is deposited on the first electrode 140.

For example, as a method of locally heating the first oxide semiconductor layer 130 below the first electrode 140, a method of irradiating a laser beam from above with respect to the first electrode 140 is used. As a wavelength of the laser beam, it is possible to select a wavelength having a feature that an absorption rate for the wavelength of the laser beam with respect to the first oxide semiconductor layer 130 is higher than an absorption rate for the wavelength of the laser beam with respect to the first electrode 140. By performing laser irradiation from above the first electrode 140 using a laser beam having such a wavelength, it is possible to selectively heat the first oxide semiconductore layer 130 below the first electrode 140 at a high temperature.

As described above, by selectively heating the first oxide semiconductor layer 130 below the first electrode 140, chemical reactions proceed between the first oxide semiconductor layer 130 and the first electrode 140 in such the region, and indium oxide in the first oxide semiconductor layer 130 is reduced. Indiums isolated by the reduction are bonded to each other, and crystallization of indium proceeds. As a result, uneven distribution region of indium is formed.

Problems Newly Recognized in the Process to the Invention

The present problem will be described with reference to FIG. 20 to FIG. 24. The problems shown below are those in which the mechanism has been newly elucidated in the process leading to the present invention.

Figure 20:
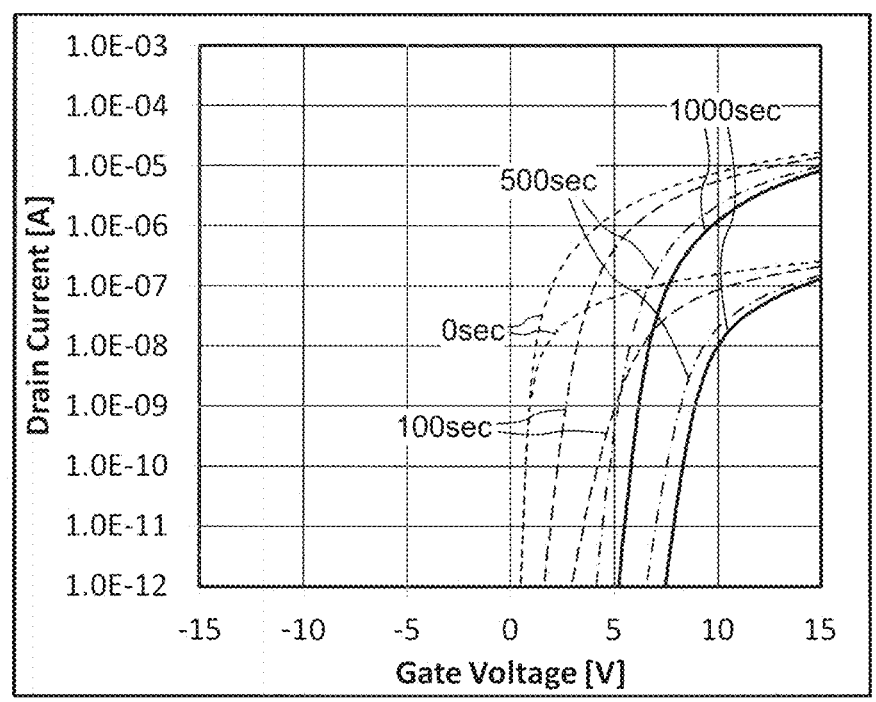
FIG. 20 is a diagram showing a reliability test result of a semiconductor device according to a comparative example of the present invention.

FIG. 20 is a graph showing the results of the reliability test of the semiconductor device according to the comparative examples. The graph of FIG. 20 is a result of evaluating a variation of electrical properties of the semiconductor device 10A by performing an NBTIS test to evaluate reliability with respect to the semiconductor device 10A according to the comparative example. The conditions of the reliability test are as follows.

Light-Irradiation Condition: White LED 8,000 nits
Gate voltage: −30 V
Source/Drain Voltage: 0 V
Stage temperature when stress is applied: 60° C.

As shown in FIG. 20, the electrical properties of the semiconductor device are evaluated prior to the stress application (0 sec) and after each stress application period (100 sec to 1000 sec). The electrical properties of the semiconductor device before and after stress application are measured as follows.

Voltage between source to drain: 0.1 V, 10 V
Gate scan voltage: −15 V to 15 V
Measurement environment: Dark room
Stage temperature at measurement: 60° C. (or R.T. (room temperature))

As shown in FIG. 20, as the stress application time increase, the threshold shifts to positive and the rise of the ON current gradually changes to slow in the semiconductor device 10A according to the comparative example. The inventors have determined that a region in which the uneven distribution of indium in the first oxide semiconductor layer 130A proceed toward the channel region 131A by the NBTIS test is caused by the phenomenon mentioned above.

Figure 21:
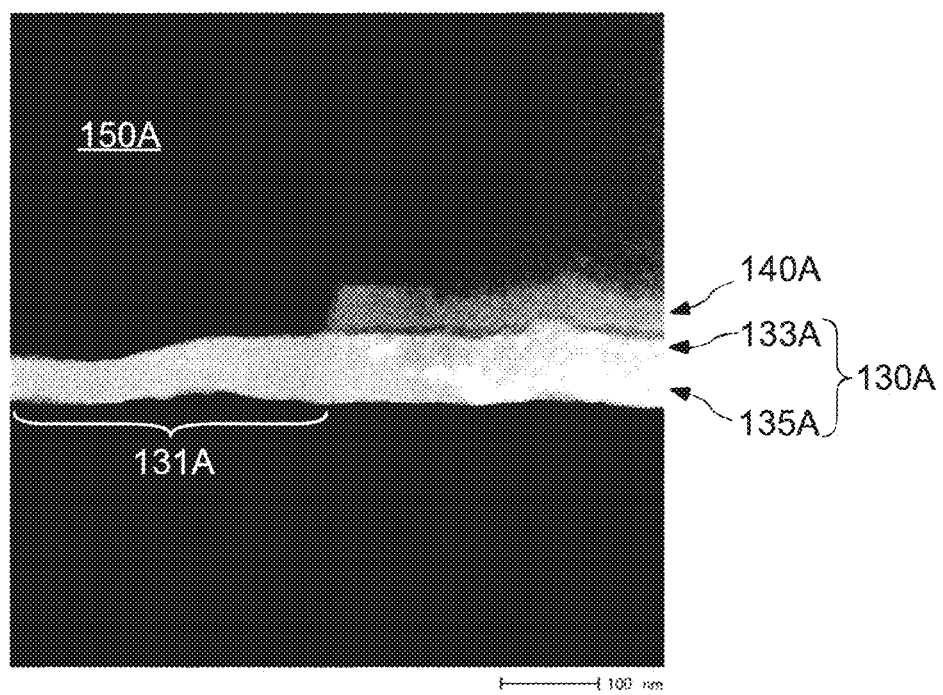
FIG. 21 is a cross-sectional HAADF-STEM image prior to a reliability test of a semiconductor device according to a comparative example of the present invention.
Figure 22:
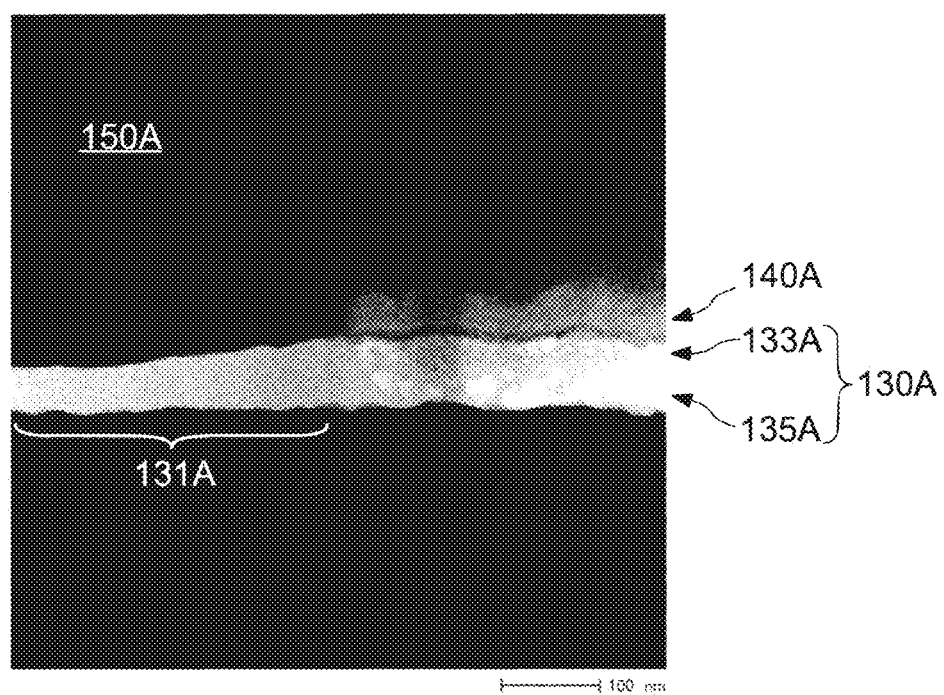
FIG. 22 is a cross-sectional HAADF-STEM image after a reliability test of a semiconductor device according to a comparative example of the present invention.

FIG. 21 and FIG. 22 are cross-sectional HAADF-STEM images of the semiconductor device of the comparative examples prior to and after the reliability test. Similar to FIG. 9 and FIG. 15, in both FIG. 21 and FIG. 22, it is confirmed that a region where indium density is high (a region which is shown whiter than the surrounding region) exists in the first oxide semiconductor layer 130A in the second region 135A. Comparing FIG. 21 and FIG. 22, although the region where indium density is high exists in the first oxide semiconductor layer 130A in the second region 135A in both STEM images, a location of the region where indium density is high after the reliability test (FIG. 22) is closer to the channel region 131A than the location of the region where indium density is high prior to the reliability test (FIG. 21). That is, it is considered that the region where indium density is high progressed to the channel region 131A by the reliability test described above.

Figure 23:
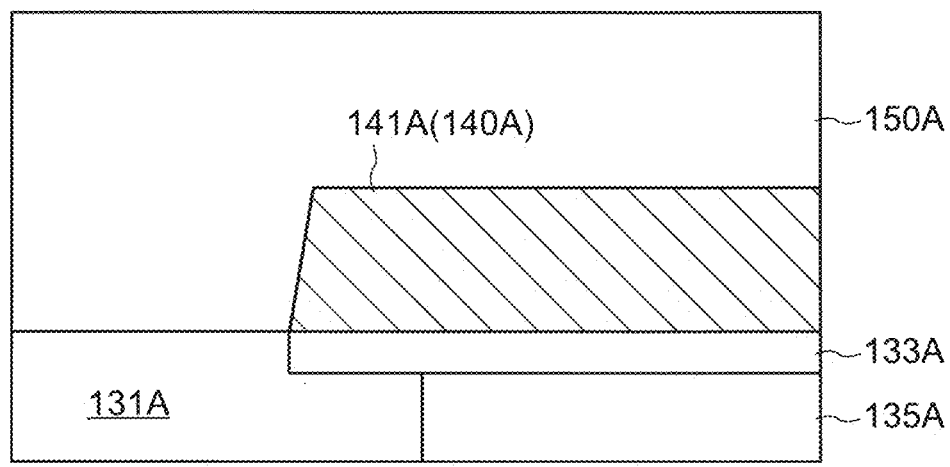
FIG. 23 is an cross-sectional view showing a status prior to a reliability test of a semiconductor device according to a comparative example of the present invention.
Figure 24:
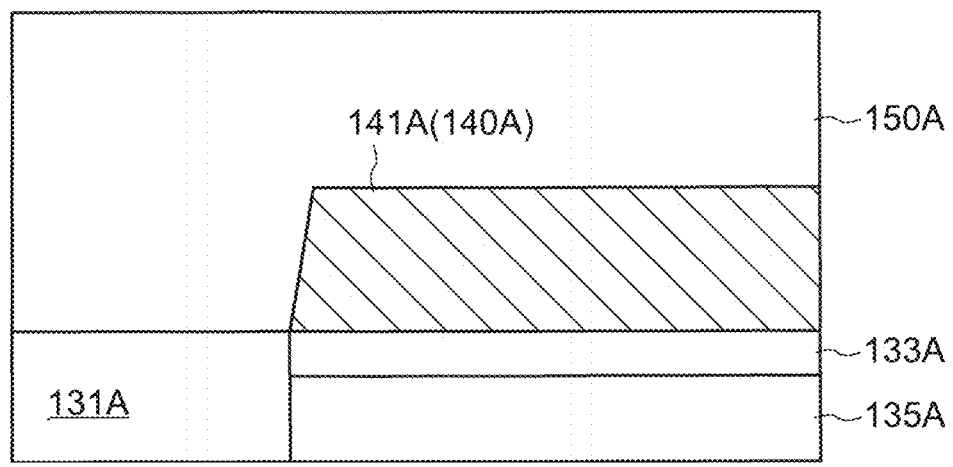
FIG. 24 is an cross-sectional view showing a status after a reliability test of semiconductor device according to a comparative example of the present invention.

FIG. 23 and FIG. 24 illustrate the phenomena shown in FIG. 21 and FIG. 22 in an easy-to-understand manner. FIG. 23 and FIG. 24 are cross-sectional view showing the condition of the semiconductor device prior to and after the reliability test according to the comparative examples, respectively. FIG. 23 corresponds to FIG. 21, and FIG. 24 corresponds to FIG. 22. The first region 133A is a region where the size of the mass with the high density of indium is relatively small. The second region 135A is a region where the size of the mass with the high density of indium is relatively large.

As shown in FIG. 23, prior to the reliability test, the second region 135A is located farther from the channel region 131A with respect to the pattern end of the first electrode 140A. Therefore, prior to the reliability test, as shown in the electrical properties of "0 sec" in FIG. 20, the rise characteristics of the ON-current could be said to be good. On the other hand, as shown in FIG. 24, after the reliability test, the second region 135A progresses toward the channel region 131A and reaches near the pattern end of the first electrode 140A. As a result, it is considered that the rising characteristic of the ON-current is deteriorated as shown in the electrical properties of "1000 sec" in FIG. 20, because the current path from the first electrodes 140A to the first oxide semiconductor layer 130A of the channel region 131A resistance becomes high.

Electrical Properties Prior to and After Reliability Test of Semiconductor Device 10

Figure 25:
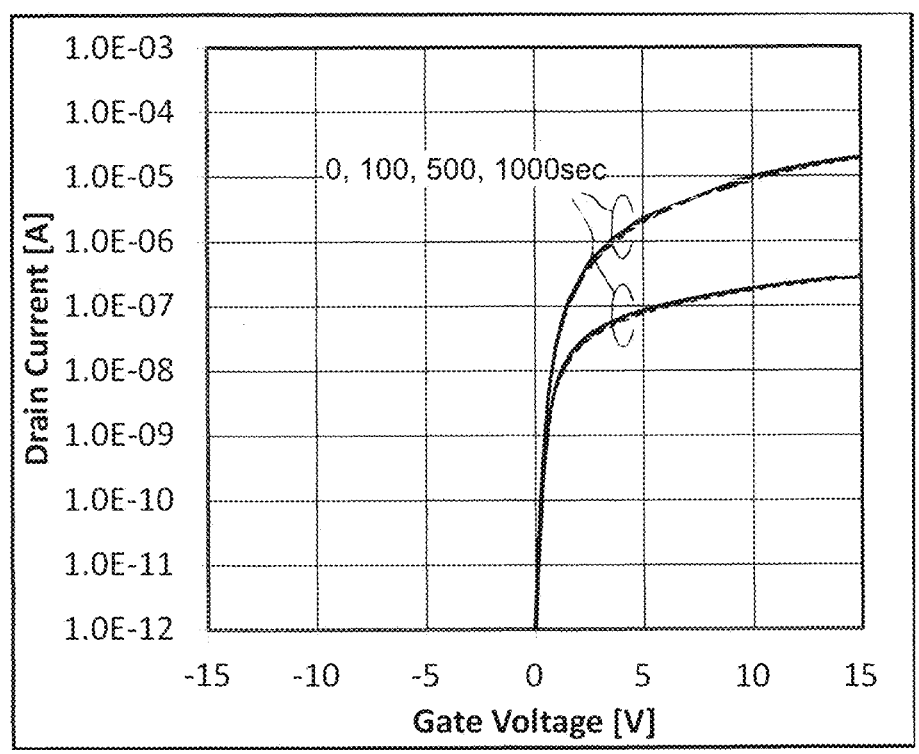
FIG. 25 is a diagram showing a reliability test result of a semiconductor device according to an embodiment of the present invention.

FIG. 25 is a graph showing result of the reliability test of the semiconductor device according to an embodiment of the present invention. The graph of FIG. 25 is a result of evaluating a variation of electrical properties of the semiconductor device 10 by performing the NBTIS test to evaluate reliability with respect to the semiconductor device 10 according to the first embodiment. The conditions of the reliability test are the same as those described above.

As shown in FIG. 25, prior to stress application (0 sec) and after each stress application period (100 sec to 1000 sec), the electrical properties are hardly changed.

Figure 26:
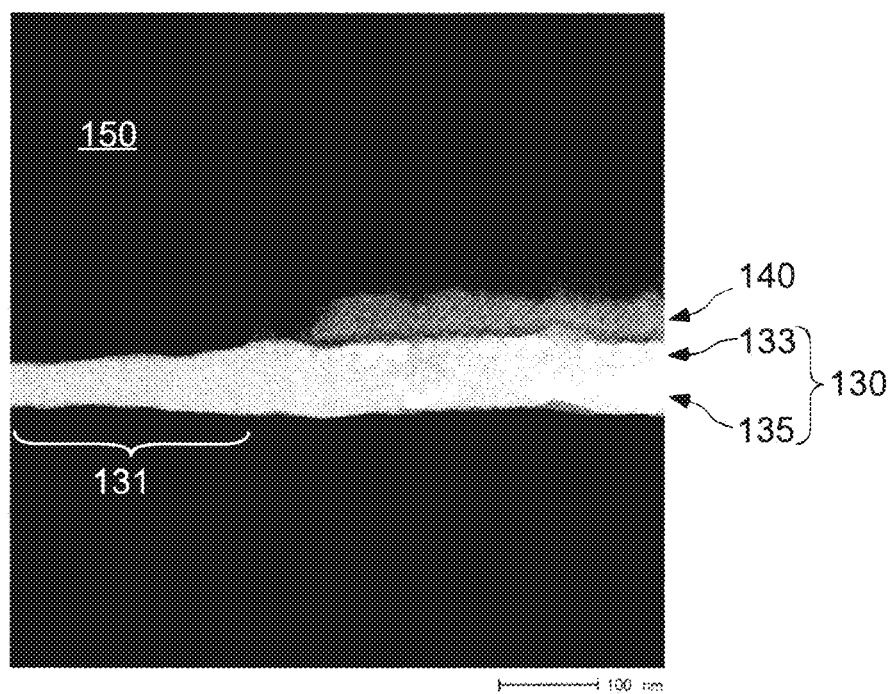
FIG. 26 is a cross-sectional HAADF-STEM image prior to a reliability test of a semiconductor device according to an embodiment of the present invention.
Figure 27:
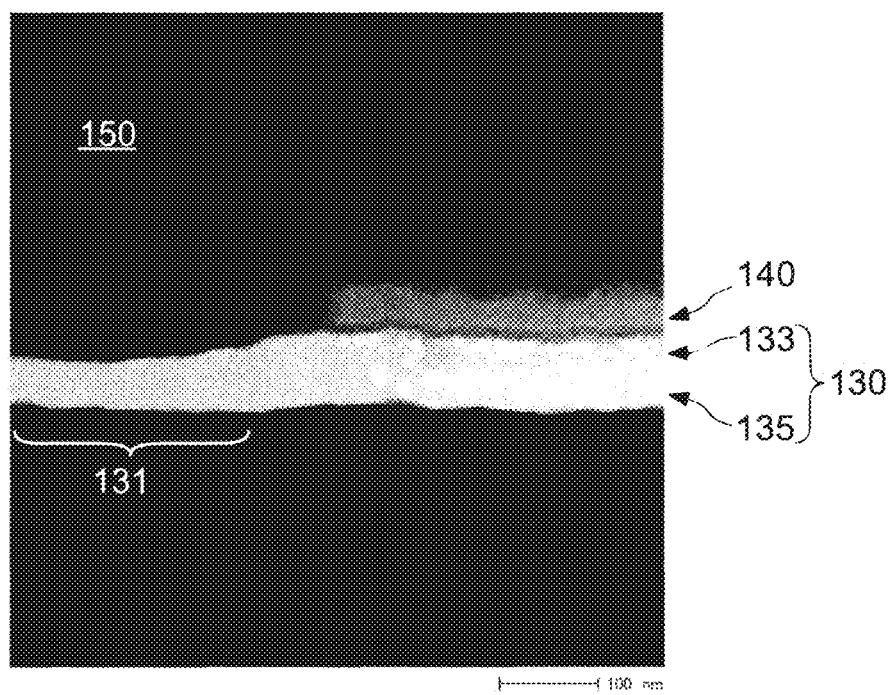
FIG. 27 is a cross-sectional HAADF-STEM image after a reliability test of a semiconductor device according to an embodiment of the present invention.

FIG. 26 and FIG. 27 are cross-sectional HAADF-STEM images of the semiconductor device according to an embodiment of the present invention prior to the reliability test.

Similar to FIG. 21 and FIG. 22, in both FIG. 26 and FIG. 27, it is confirmed that a region where indium density is high exists in the first oxide semiconductor layer 130 in the second region 135. A region where indium density is high after the reliability test (FIG. 27) is closer to the channel region 131 than a region where indium density is high prior to the reliability test (FIG. 26). However, the amount of progress of region having a higher indium density toward the channel region 131 prior to and after the reliability test is smaller than the amount of progress of semiconductor device 10A according to the comparative example. Even after the reliability test (FIG. 27), the region having the higher indium density does not reach the vicinity of pattern end of the first electrodes 140. Considering also the results of the electrical properties in FIG. 25, in semiconductor device 10 of the present embodiment, it is considered that the progress of region having the higher indium density to the channel region 131 is interrupted at the position shown in FIG. 27.

Figure 28:
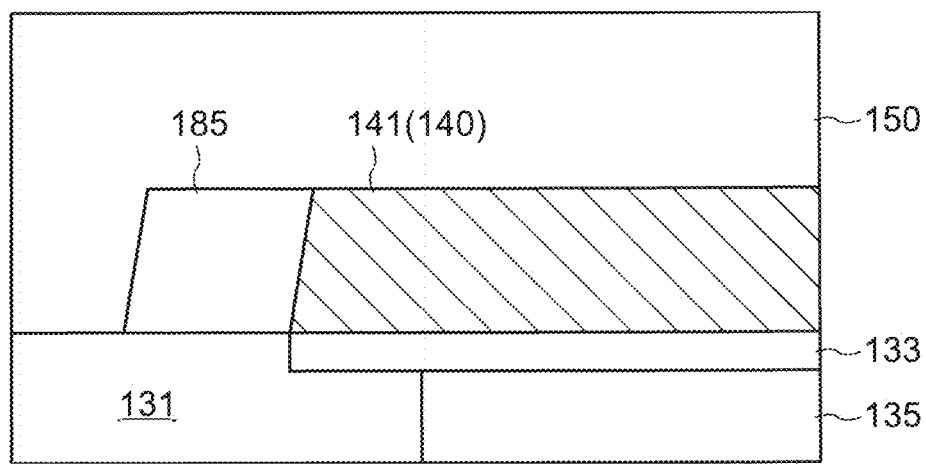
FIG. 28 is a cross-sectional view illustrating a status prior to a reliability test of a semiconductor device according to an embodiment of the present invention.
Figure 29:
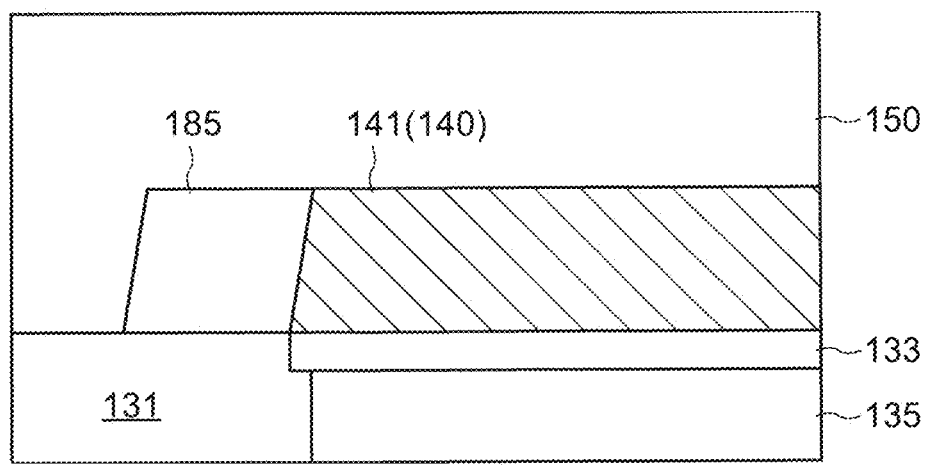
FIG. 29 is a cross-sectional view illustrating a status after a reliability test of a semiconductor device according to an embodiment of the present invention.

FIGS. 28 and 29 illustrate the phenomena shown in FIGS. 26 and 27 in an easy-to-understand manner. FIG. 28 and FIG. 29 are cross-sectional view showing the condition of the semiconductor device prior to and after the reliability test, according to an embodiment of the present disclosure, respectively. FIG. 28 corresponds to FIG. 26, and FIG. 29 corresponds to FIG. 27. The first region 133 is a region where the size of mass with the high density of indium is relatively small. The second region 135 is a region where the size of the mass with the high density of indium is relatively large.

Similar to FIG. 23 and FIG. 24, the stress of the reliability test causes the second region 135 to proceed toward the channel region 131, but the second region 135 does not reach the vicinity of pattern end of the first electrodes 140 even after the reliability test. Consequently, the high resistance of the current path toward the first oxide semiconductor layer 130 in the channel region 131 from the first electrode 140 is suppressed. As a result, it is considered that the deterioration of the rise characteristics of the ON current was suppressed as shown in FIG. 25. Considering the difference between semiconductor device 10 according to the first embodiment and semiconductor device 10A according to the comparative examples, it is considered that the presence of the first oxide portion 185 contributes to the above-mentioned phenomena.

As described above, according to semiconductor device 10 of the present embodiment, it is possible to suppress the progress of the second region 135 in which uneven distribution of indium occurs toward the channel region 131 due to the stress of the reliability test. As a result, it is possible to suppress the electrical properties from changing due to the reliability test. Therefore, it is possible to achieve a highly reliable semiconductor device 10.

Second Embodiment

A display device using a semiconductor device according to an embodiment of the present invention will be described with reference to FIGS. 30 to 34. In the embodiment shown below, it will be described with reference to a configuration in which semiconductor device described in the first embodiment described above is applied to the circuitry of liquid crystal display device.

Summary of Display Device 20B

Figure 30:
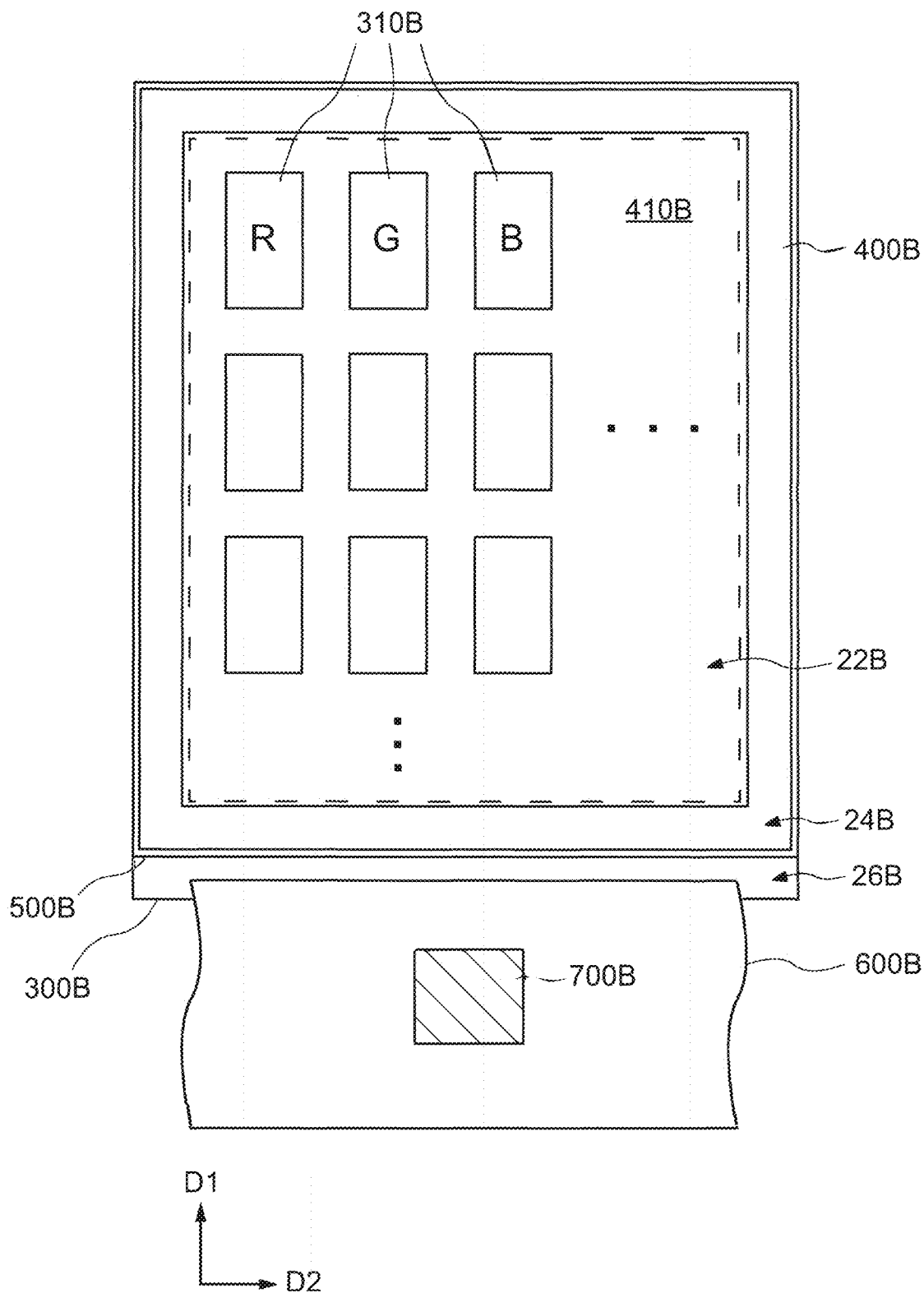
FIG. 30 is a planar view illustrating an outline of a display device according to an embodiment of the present invention.

FIG. 30 is a plane view showing a summary of a display device according to one embodiment of the present invention. As is shown in FIG. 30, the display device 20B includes an array substrate 300B, a seal portion 400B, a counter substrate 500B, a flexible printed circuit substrate 600B (FPC 600B) and an IC chip 700B. The array substrate 300B and the counter substrate 500B are bonded together by the seal portion 400B. A plurality of pixel circuits 310B are arranged in a matrix in a liquid crystal region 22B which is surrounded by the seal portion 400B. The liquid crystal region 22B is a region which overlaps a liquid crystal element 410B described herein in a plane view.

A seal region 24B in which the seal portion 400B is arranged is a region in the periphery of the liquid crystal region 22B. The FPC 600B is arranged in a terminal region 26B. The terminal region 26B is a region where the array substrate 300B is exposed from the counter substrate 500B, and is arranged on the outer side of the seal region 24B. Furthermore, the outer side of the seal region 24B means a region in which the seal portion 400B is arranged and the outer side of the region surrounded by the seal portion 400B. The IC chip 700B is arranged above the FPC 600B. The IC chip 700B supplies a signal for driving each pixel circuit 310B.

Circuit Structure of Display Device 20B

Figure 31:
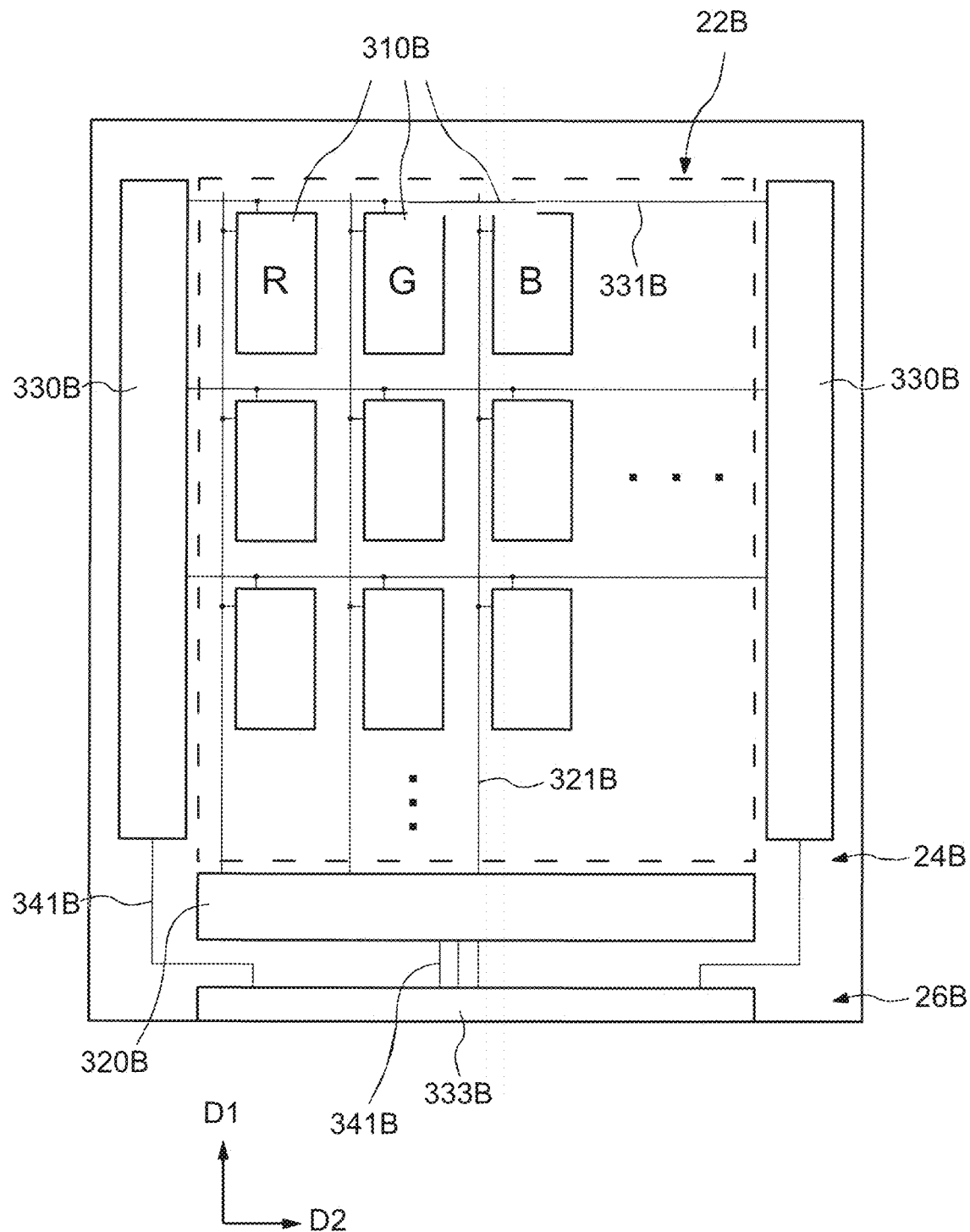
FIG. 31 is a block diagram illustrating a circuit structure of a display device according to an embodiment of the present invention.

FIG. 31 is a block diagram showing a circuit structure of a display device according to one embodiment of the present invention. As is shown in FIG. 31, a source driver circuit 320B is arranged at a position adjacent in the D1 direction (column direction) of the liquid crystal region 22B where the pixel circuit 310B is arranged, and a gate driver circuit 330B is arranged at a position adjacent in the D2 direction (row direction) of the liquid crystal region 22B. The source driver circuit 320B and the gate driver circuit 330B are arranged in the seal region 24B described above. However, the region where the source driver circuit 320B and the gate driver circuit 330B are arranged is not limited to the seal region 24B. The source driver circuit 320B and the gate driver circuit 330B may be arranged in a region outside a region where the pixel circuit 310B is arranged.

A source wiring 321B extends from the source driver circuit 320B in the D1 direction and is connected to a plurality of pixel circuits 310B arranged in the D1 direction. A gate wiring 331B extends from the gate driver circuit 330B in the D2 direction and is connected to a plurality of pixel circuits 310B arranged in the D2 direction.

A terminal portion 333B is arranged in the terminal region 26B. The terminal portion 333B and the source driver circuit 320B are connected by a connection wiring 341B. Similarly, the terminal portion 333B and the gate driver circuit 330B are connected by a connection wiring 341B. By connecting the FPC 600B to the terminal portion 333B, an external device which is connected to the FPC 600B and the display device 20B are connected, and a signal from the external device drives each pixel circuit 310B arranged in the display device 20B.

The semiconductor device 10 shown in the first embodiment is applied to transistors included in the pixel circuit 310B, the source driver circuit 320B and the gate driver circuit 330B.

Pixel Circuit 310B of Display Device 20B

Figure 32:
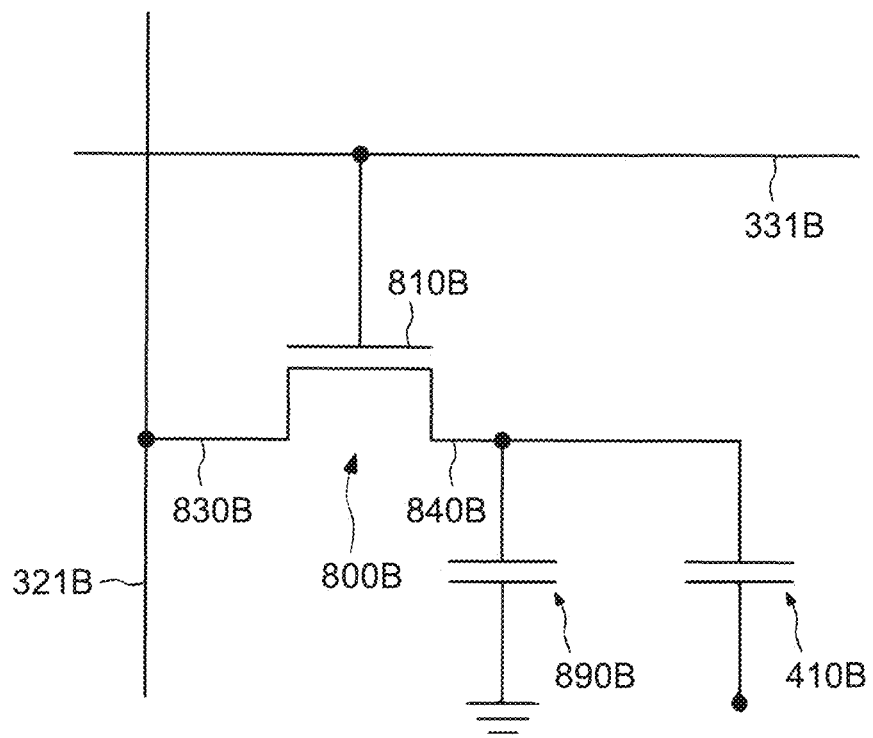
FIG. 32 is a circuit diagram illustrating a pixel circuit of a display device according to an embodiment of the present invention.

FIG. 32 is a circuit diagram showing a pixel circuit of a display device according to one embodiment of the present invention. As is shown in FIG. 32, the pixel circuit 310B includes elements such as a transistor 800B, a storage capacitor 890B and a liquid crystal element 410B. The transistor 800B includes a first gate electrode 810B, a first source electrode 830B and a first drain electrode 840B. The first gate electrode 810B is connected to the gate wiring 331B. The first source electrode 830B is connected to the source wiring 321B. The first drain electrode 840B is connected to the storage capacitor 890B and the liquid crystal element 410B. The semiconductor device 10 shown in the first embodiment is applied to the transistor shown in FIG. 32. Furthermore, although 830B is referred to as a source electrode and 840B is referred to as a drain electrode in the present embodiment for the convenience of explanation, the function as the source and the function as the drain of each electrode may be interchanged.

Cross-Sectional Structure of Display Device 20B

Figure 33:
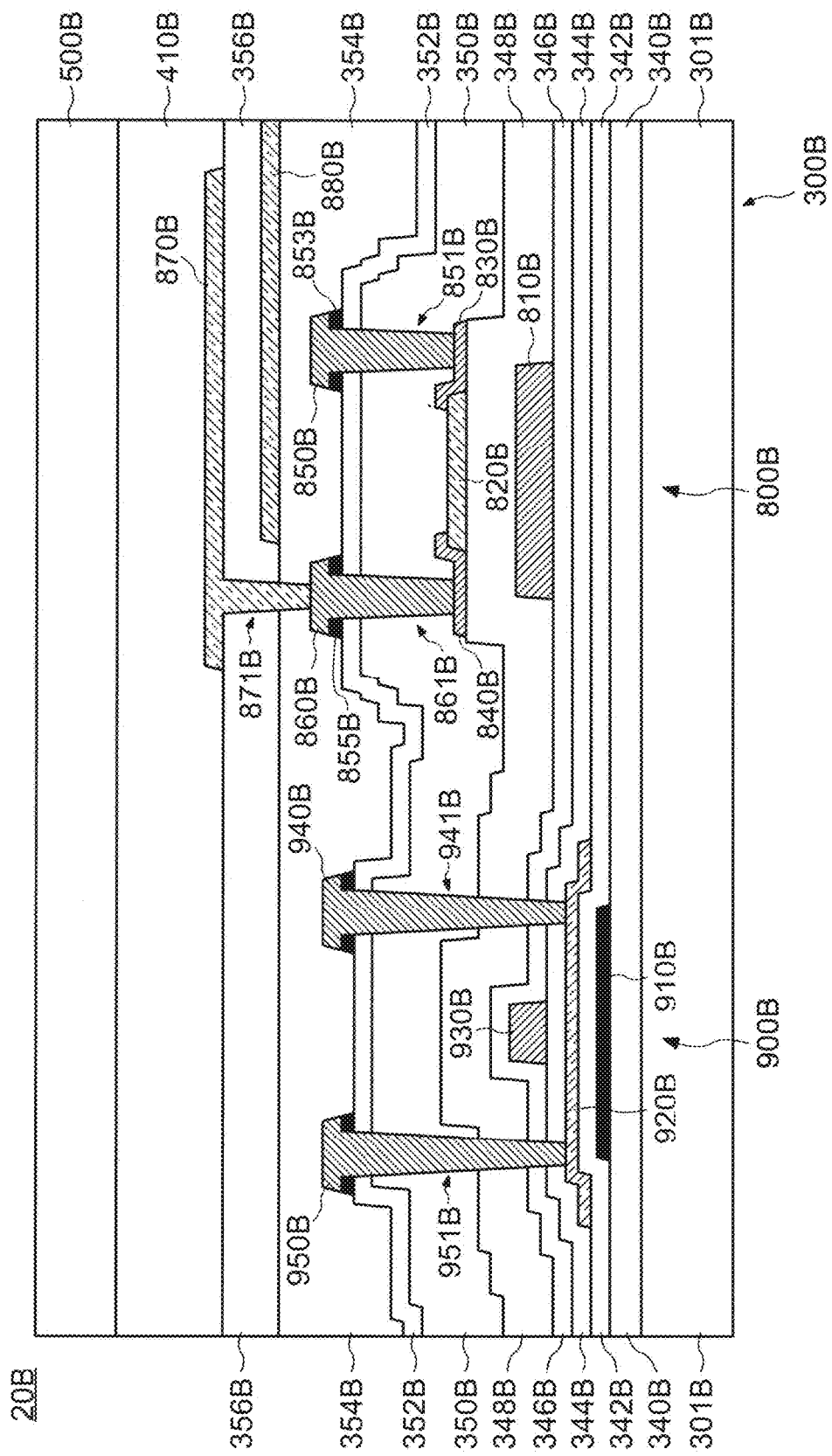
FIG. 33 is a cross-sectional view of a display device according to an embodiment of the present invention.

FIG. 33 is a cross-sectional diagram of a display device according to one embodiment of the present invention. As is shown in FIG. 33, the display device 20B is a display device in which transistors 800B and 900B which have different structures are arranged above the same substrate. The structure of the transistor 800B is different from the structure of the transistor 900B. Specifically, the transistor 800B is a bottom-gate type transistor in which the first oxide semiconductor layer 820B is used as a channel. The transistor 900B is a top-gate type transistor in which the semiconductor layer 920B is used as a channel. For example, the transistor 800B is used for the pixel circuit 310B, and the transistor 900B is used for the source driver circuit 320B and the gate driver circuit 330B. Furthermore, the transistor 900B may be used for the pixel circuit 310B.

The transistor 800B is a transistor formed above the substrate 301B, and a transistor having one or more insulating layers as base layers. In the present embodiment, the insulating layers 340B, 342B, 344B and 346B are used as base layers. A first gate electrode 810B is arranged above the insulating layer 346B. A first oxide semiconductor layer 820B is arranged above the first gate electrode 810B. The first gate electrode 810B is opposed to the first oxide semiconductor layer 820B. An insulating layer 348B which functions as a gate insulating layer is arranged between the first gate electrode 810B and the first oxide semiconductor layer 820B. A first source electrode 830B is arranged at one end portion of a pattern of the first oxide semiconductor layer 820B, and a first drain electrode 840B is arranged at the other end portion of a pattern of the first oxide semiconductor layer 820B. The first source electrode 830B and the first drain electrode 840B are connected to the first oxide semiconductor layer 820B on the top surface and side surface of the first oxide semiconductor layer 820B respectively.

The first insulating layers 350B and 352B are arranged above the first oxide semiconductor layer 820B, the first source electrode 830B and the first drain electrode 840B. Aperture 851B and 861B are arranged in the first insulating layers 350B and 352B. A first source wiring 850B is arranged above the first insulating layer 352B and inside the aperture 851B. A first drain wiring 860B is arranged above the first insulating layer 352B and inside the aperture 861B. An oxide layer 853B is arranged between the top surface of the first insulating layers 352B and the first source wiring 850B. An oxide layer 855B is arranged between the top surface of the first insulating layers 352B and the first drain wiring 860B.

A second insulating layer 354B is arranged above the first source wiring 850B and the first drain wiring 860B. A common electrode 880B which is arranged in common for a plurality of pixels is arranged above the second insulating layer 354B. A second insulating layer 356B is arranged above the common electrode 880B. A third aperture 871B is arranged in the second insulating layers 354B and 356B. A pixel electrode 870B is arranged above the second insulating layer 356B and inside the third aperture 871B. The pixel electrode 870B is connected to the first drain wiring 860B.

Figure 34:
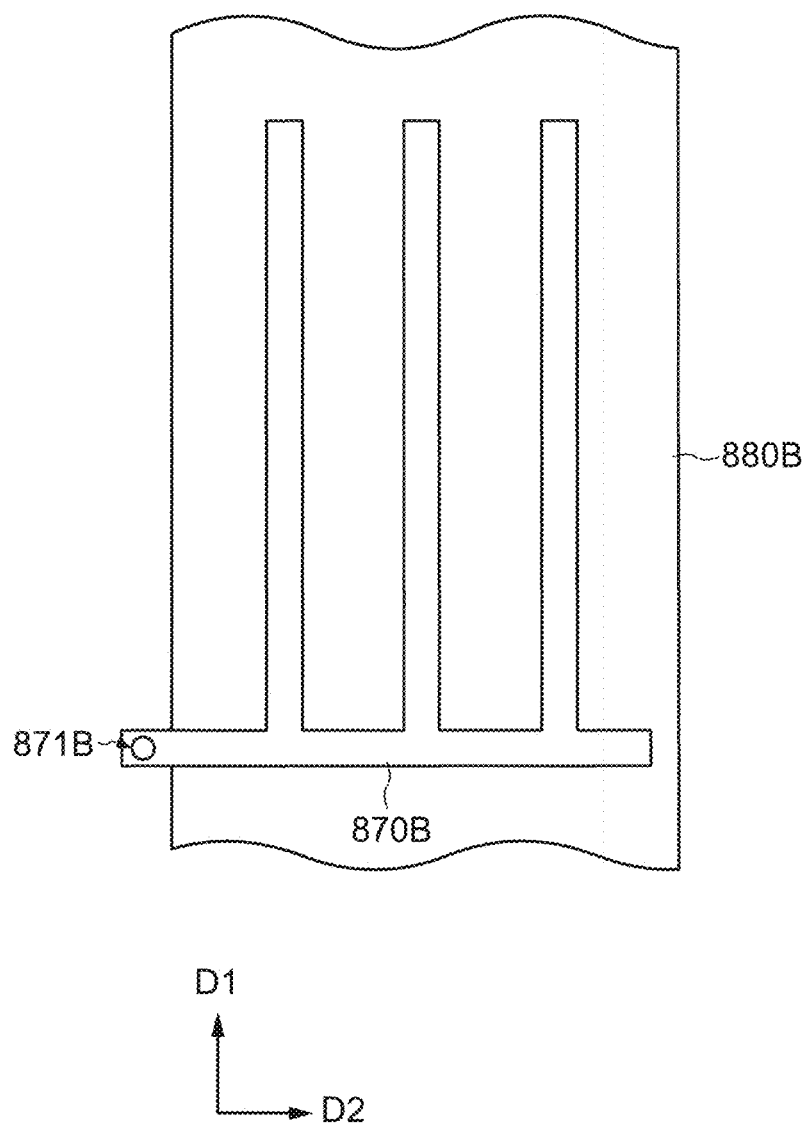
FIG. 34 is a planar view of a pixel electrode and a common electrode of a display device according to an embodiment of the present invention.

FIG. 34 is a plane view of a pixel electrode and a common electrode of a display device according to one embodiment of the present invention. As is shown in FIG. 34, the common electrode 880B has an overlapping region which overlaps with the pixel electrode 870B in a plane view, and a non-overlapping region which does not overlap with the pixel electrode 870B. When a voltage is supplied between the pixel electrode 870B and the common electrode 880B, a horizontal electric field is formed from the pixel electrode 870B in the overlapping region toward the common electrode 880B in the non-overlapping region. The gradation of the pixel is determined by the operation of liquid crystal molecules which are included in the liquid crystal element 410B by the horizontal electric field.

In the structure described above, it is possible to apply the semiconductor devices 10 in FIG. 1 as a transistor 800B. In this case, when FIG. 1 is compared with FIG. 33, each member in each drawing corresponds as follows. The first gate electrode 110 corresponds to the first gate electrode 810B. The first gate insulating layer 120 corresponds to the insulating layer 348B. The first oxide semiconductor layer 130 corresponds to the first oxide semiconductor layer 820B. The first source electrode 141 corresponds to the first source electrode 830B. The first drain electrode 143 corresponds to the first drain electrode 840B. The first insulating layer 150 corresponds to the first insulating layers 350B and 352B. The first aperture 151 corresponds to the aperture 851B. The first aperture 153 corresponds to the aperture 861B. The oxide layer 160 corresponds to the oxide layers 853B and 855B. The first source wiring 171 corresponds to the first source wiring 850B. The first drain wiring 173 corresponds to the first drain wiring 860B.

The transistor 900B is a transistor which is formed in the substrate 301B, and the insulating layer 340B is used as a base layer. A light shielding layer 910B is arranged above the insulating layer 340B. An insulating layer 342B is provided over the light shielding layer 910B. A semiconductor layer 920B is arranged above the insulating layer 342B. A second gate electrode 930B is arranged above the semiconductor layer 920B. An insulating layer 344B which functions as a gate insulating layer is arranged between the semiconductor layer 920B and the second gate electrode 930B. Insulating layers 346B, 348B, 350B and 352B are arranged above the second gate electrode 930B. Aperture 941B and 951B are arranged in these insulating layers. A second source wiring 940B is arranged above the insulating layer 352B and inside the aperture 941B. A second drain wiring 950B is arranged above the insulating layer 352B and inside the aperture 951B. An insulating layer 354B is arranged above the second source wiring 940B and the second drain wiring 950B. In other words, the second gate electrode 930B is arranged under a layer (insulating layer 348B) which is the same layer as the gate insulating layer of the transistor 800B.

Third Embodiment

Figure 35:
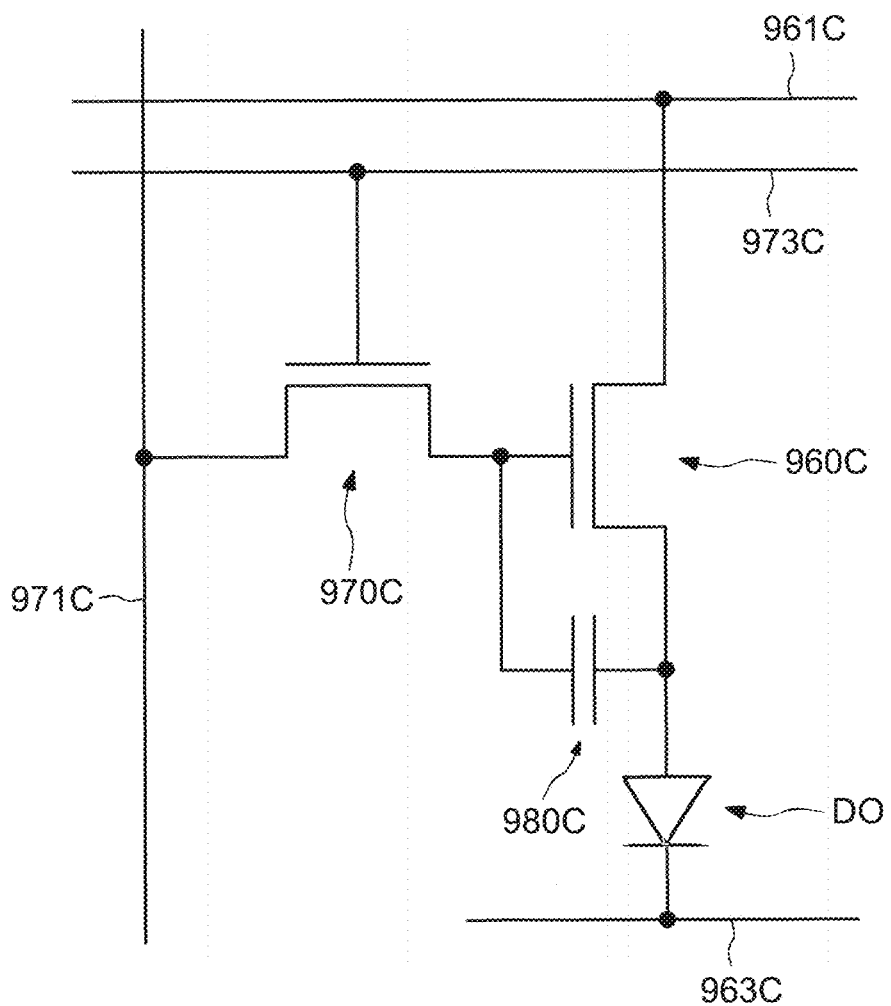
FIG. 35 is a circuit diagram illustrating a pixel circuit of a display device according to an embodiment of the present invention.
Figure 36:
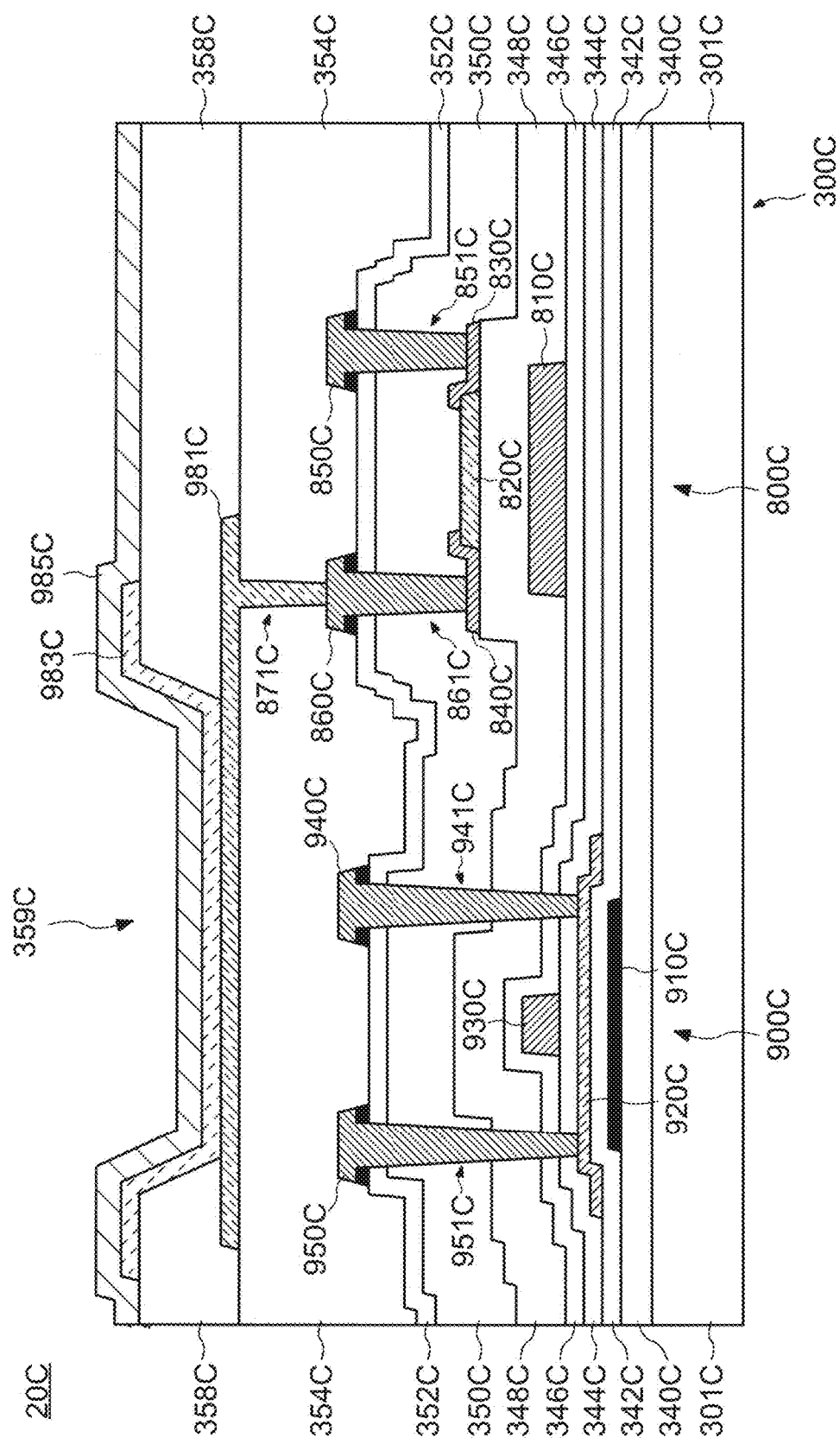
FIG. 36 is a cross-sectional view of a display device according to an embodiment of the present invention.

A display device using a semiconductor device according to one embodiment of the present invention are explained using FIG. 35 and FIG. 36. Furthermore, in the embodiment described below, a structure is explained in which the semiconductor device explained in the first embodiment is applied to a circuit of an organic EL display device. Furthermore, since a summary and circuit structure of the display device 20C are the same as those shown in FIG. 30 and FIG. 31, an explanation is omitted.

Pixel Circuit 310C of Display Device 20C

FIG. 35 is a circuit diagram showing a pixel circuit of a display device according to one embodiment of the present invention. As is shown in FIG. 35, the pixel circuit 310C includes elements such as a drive transistor 960C, a selection transistor 970C, a storage capacitor 980C and a light emitting element DO. The source electrode of the selection transistor 970C is connected to the signal line 971C, and the gate electrode of the selection transistor 970C is connected to the gate line 973C. The source electrode of the drive transistor 960C is connected to an anode power supply line 961C, and the drain electrode of the drive transistor 960C is connected to one end of the light emitting element DO. The other end of the light emitting element DO is connected to a cathode electrode 963C. The gate electrode of the driving transistor 960C is connected to the drain electrode of the selection transistor 970C. The storage capacitor 980C is connected to the gate electrode and the drain electrode of the drive transistor 960C. A gradation signal for determining the light emitting intensity of the light emitting element DO is supplied to the signal line 971C. A signal for selecting a pixel row in which the gradation signal described above is written is supplied to the gate line 973C.

Cross-Sectional Structure of Display Device 20C

FIG. 36 is a cross-sectional diagram of a display device according to one embodiment of the present invention. Although the structure of the display device 20C shown in FIG. 36 is similar to the display device 20B shown in FIG. 33, they are different in that the structure is further above the insulating layer 354C of the display device 20C but here the structure is above the insulating layer 354B of the display device 20B. Herein, in the structure of the display device 20C shown in FIG. 36, an explanation of the same structure as the display device 20B shown in FIG. 33 is omitted, and differences from the display device 20B are explained.

As is shown in FIG. 36, the display device 20C includes a pixel electrode 981C, a light emitting layer 983C and a common electrode 985C above the insulating layer 354C. The pixel electrode 981C is arranged above the insulating layer 354C and inside the third aperture 871C. An insulating layer 358C is arranged above the pixel electrode 981C. An aperture 359C is arranged in the insulating layer 358C. The aperture 359C corresponds to a light emitting region. That is, the insulating layer 358C defines a pixel. A light emitting layer 983C and a common electrode 985C are arranged above the pixel electrode 981C exposed through the aperture 359C. The pixel electrode 981C and the light emitting layer 983C are separately arranged for each pixel. On the other hand, the common electrode 985C is arranged in common for a plurality of pixels. Different materials are used for the light emitting layer 983C depending on the display color of the pixel.

In the second embodiment and third embodiment, although a structure was exemplified in which the semiconductor device explained in the first embodiment was applied to a liquid crystal display device and an organic EL display device, displays other than these display devices (for example, a self-luminous display device or an electronic paper display device other than an organic EL display device) may also be applied with the semiconductor device. In addition, the semiconductor device described above can be applied without any particular limitation from a small sized display device to a large sized display device.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A semiconductor device comprising:
   an oxide semiconductor layer including indium;
   a gate electrode facing to the oxide semiconductor layer;
   a gate insulating layer between the oxide semiconductor layer and the gate electrode;
   a first conductive layer arranged above the oxide semiconductor layer and being in contact with the oxide semiconductor layer from above the oxide semiconductor layer;
   an oxide portion formed on the oxide semiconductor layer and at an edge of the first conductive layer, the oxide portion being a oxide of the first conductive layer,
   wherein indium is unevenly distributed in a first region among the oxide semiconductor layer, the first region overlapping with the first conductive layer in a planar view.

2. The semiconductor device according to claim 1,
   wherein indium is unevenly distributed in a second region among the oxide semiconductor layer, the second region overlapping with the oxide portion in a planar view,
   a degree of unevenly distribution of indium in the oxide semiconductor layer in the second region is smaller than a degree of uneven distribution of indium in the oxide semiconductor layer in the first region.

3. The semiconductor device according to claim 2,
   wherein indium is not unevenly distributed in the oxide semiconductor layer in the second region.

4. The semiconductor device according to claim 1,
   wherein the oxide portion has a conductive property.

5. The semiconductor device according to claim 1, further comprising a second conductive layer on the first conductive layer,
   wherein the oxide portion is located a channel region side of the oxide semiconductor layer than an edge of the second conductive layer.

6. The semiconductor device according to claim 1,
   wherein the gate electrode and the gate insulating layer are provided under the oxide semiconductor layer.

7. A manufacturing method of semiconductor device comprising:
   forming an oxide semiconductor layer including indium, a gate electrode facing to the oxide semiconductor layer and a gate insulating layer between the oxide semiconductor layer and the gate electrode;

forming a first conductive layer having an edge on the oxide semiconductor layer;

forming an oxide portion of the first conductive layer at the edge of the first conductive layer by performing a $N_2O$ plasma treatment to the edge of the first conductive layer, forming an insulating layer covering the oxide semiconductor layer and the first conductive layer after the $N_2O$ plasma treatment, and segregating indium in a region of the oxide semiconductor layer overlapping with the first conductive layer in a plan view by performing a heat treatment after forming the insulating layer.

* * * * *